(12) United States Patent
Hayashi

(10) Patent No.: US 6,664,784 B1
(45) Date of Patent: Dec. 16, 2003

(54) MAGNETO-RESISTIVE SENSOR WITH ZR BASE LAYER AND METHOD OF FABRICATING THE SAME

(75) Inventor: Kazuhiko Hayashi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/448,174

(22) Filed: Nov. 24, 1999

(30) Foreign Application Priority Data

Nov. 26, 1998 (JP) .......................................... 10-336347

(51) Int. Cl.⁷ .............................................. G01R 33/02
(52) U.S. Cl. ...................................... 324/252; 360/313
(58) Field of Search ........................... 324/207.21, 252, 324/210–212; 360/313, 324, 324.1, 325; 338/32 R

(56) References Cited

U.S. PATENT DOCUMENTS

| | | | | |
|---|---|---|---|---|
| 4,949,039 A | | 8/1990 | Grunberg | 324/252 |
| 5,206,590 A | | 4/1993 | Dieny et al. | 324/252 |
| 5,301,079 A | | 4/1994 | Cain et al. | 360/113 |
| 5,766,743 A | | 6/1998 | Fujikata et al. | |
| 5,771,141 A | * | 6/1998 | Ohtsuka et al. | 360/322 |
| 5,849,422 A | | 12/1998 | Hayashi | 428/611 |
| 5,989,690 A | | 11/1999 | Fujikata et al. | |
| 6,040,961 A | * | 3/2000 | Gill | 360/113 |
| 6,114,850 A | * | 9/2000 | Hayashi | 324/252 |
| 6,172,859 B1 | * | 1/2001 | Watanabe et al. | 360/327.3 |
| 6,229,678 B1 | * | 5/2001 | Xue et al. | 360/327.22 |
| 2002/0036497 A1 | * | 3/2002 | Inage et al. | 324/252 |

FOREIGN PATENT DOCUMENTS

| | | |
|---|---|---|
| JP | 2-61572 | 3/1990 |
| JP | 4-358310 | 12/1992 |
| JP | 6-203340 | 7/1994 |
| JP | 7-262529 | 10/1995 |
| JP | 9-50611 | 2/1997 |
| JP | 9-120509 | 5/1997 |
| JP | 10-92638 | 4/1998 |
| JP | 410256621 | * 9/1998 |

OTHER PUBLICATIONS

Patent Abstract of 21$^{st}$ Japan Applied Magnetic Academy Conference, 1997, p. 26.

D.A. Thompson et al., "Thin Film Magnetoresistors in Memory, Storage, and Related Applications", IEEE Transactions on Magnetics, Vol–MAG–11, No. 4, July 1975.

* cited by examiner

Primary Examiner—Jay Patidar
(74) Attorney, Agent, or Firm—Foley & Lardner

(57) ABSTRACT

There is provided a magneto-resistive sensor including (a) a multi-layered structure including a base layer, a magnetic layer, and a non-magnetic layer, the magnetic and non-magnetic layers being deposited on or above the base layer, the multi-layered structure having a sense region therein, and (b) a pair of electrode layers electrically connected to the sense region at its opposite sides, the electrode layers leading a sense current into the sense region at one side thereof and leading the sense current out of the sense region through the other side thereof, the magneto-resistive sensor detecting a magnetic field in accordance with fluctuation in a resistance in the sense region, the base layer being composed of zirconium (Zr) or alloy thereof. The magneto-resistive sensor makes it possible to provide a magneto-resistive layer having crystallinity superior to almost the same degree as crystallinity obtained when a base layer is composed of Ta, and to ensure a high resistance-change ratio.

45 Claims, 15 Drawing Sheets

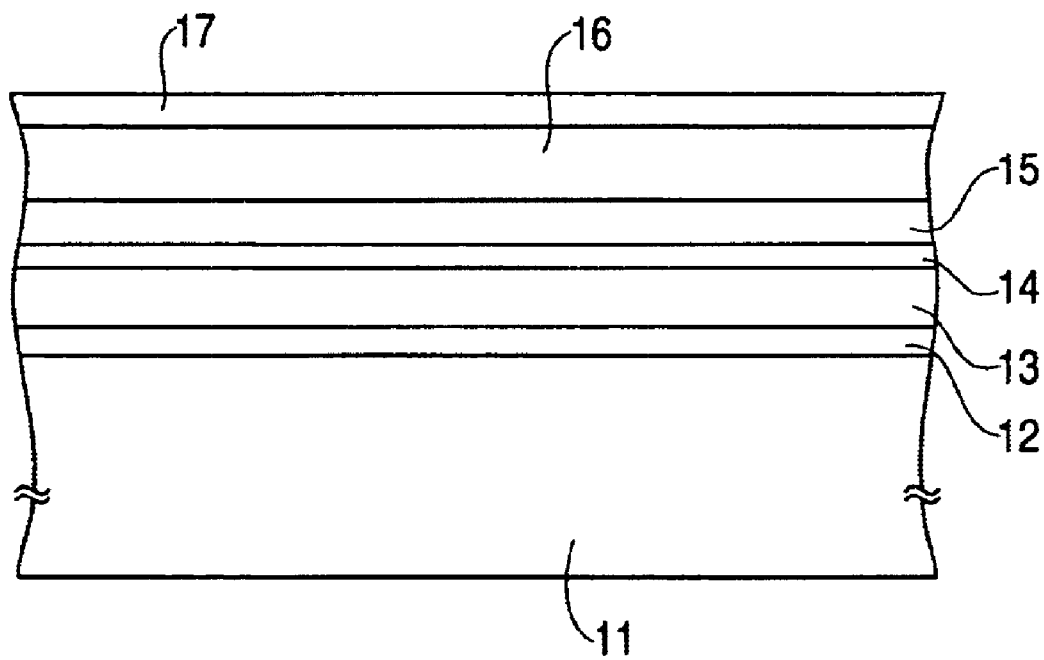

MAGNETO-RESISTIVE SENSOR WITH ZR BASE LAYER AND METHOD OF FABRICATING THE SAME

BACKGROUND OF THE INVENTION

1. Field of the Invention

The invention relates to a magneto-resistive sensor detecting magnetically recorded data out of a medium having magnetically stored data therein, a method of fabricating the same, and an apparatus for magnetically reproducing data, including the same.

2. Description of the Related Art

There have been known a magneto-resistive sensor (hereinafter, referred to simply as "MR sensor") and a magneto-resistive head (hereinafter, referred to simply as "MR head") for detecting a magnetic field. These sensor and head read magnetically recorded data out of a medium in which data have been magnetically stored, with a high linear density.

On detecting a magnetic field, MR sensor varies its electrical resistance in accordance with intensity and direction of the detected magnetic field. That is, MR sensor detects fluctuation in electrical resistance therein to thereby detect a magnetic field.

MR sensor having the above-mentioned function can be grouped into a sensor which operates on the basis of anisotropic magneto-resistive effect (hereinafter, referred to simply as "AMR") and a sensor which operates on the basis of giant magneto-resistive effect (hereinafter, referred to simply as "GMR"). Among GMR, spin-valve effect magneto-resistive effect is well known to those skilled in the art.

An example of AMR type MR sensor is described, for instance, in D. A. Thomson et al., "Memory, Storage, and Related Applications", IEEE Trans. on Mag. MAG-11, pp. 1039, 1975.

In AMR type MR sensor, electrical resistance is varied in proportion to $\cos^2\theta$ wherein $\theta$ indicates an angle between an orientation of magnetization in a magnetic layer (MR layer) which orientation is varied in accordance with a magnetic field of a signal, and a direction in which a sense current flows in the MR sensor. AMR type MR sensor is generally designed to include a magnetization-bias layer for applying magnetization-bias to MR layer, in order to suppress Barkhausen noise by suppressing formation of magnetic domain in MR layer. The magnetization-bias layer is formed at opposite sides of a sense region of MR layer, and applies magnetization-bias to MR layer in a direction in which a sense current flows. Such magnetization-bias layer is composed of anti-ferromagnetic material such as FeMn, NiMn and nickel oxide, for instance.

A spin-valve effect type MR sensor, which is one of GMR type MR sensors, is generally designed to include MR layer comprised of a multi-layered structure including two magnetic layers, and a non-magnetic layer sandwiched between the magnetic layers. Since fluctuation in resistance in MR layer is dependent on spin-dependent transmission of conduction electrons between the two magnetic layers sandwiching the non-magnetic layer therebetween, and spin-dependent scattering which occurs at interfacial planes among the layers in association with the spin-dependent transmission, MR layer generates significant magneto-resistive effect. Specifically, electrical resistance in MR layer is varied in proportion to $\cos\theta$ wherein $\theta$ indicates an angle between magnetization orientations of the two magnetic layers.

The spin-valve effect type MR sensor having such a structure as mentioned above has higher sensitivity than that of AMR type MR sensor, and hence, exhibits greater fluctuation in electrical resistance than that of AMR type MR sensor.

Examples of the above-mentioned spin-valve effect type MR sensor are suggested as follows.

Japanese Unexamined Patent Publication No. 2-61572 has suggested a magneto-resistive sensor including a multi-layered structure having a non-magnetic layer, two ferromagnetic layers sandwiching the non-magnetic layer therebetween, an anti-ferromagnetic layer making contact with one of the ferromagnetic layers. The ferromagnetic layers are composed of ferromagnetic transition metals or alloy thereof, and the anti-ferromagnetic layer is composed of FeMn.

Japanese Unexamined Patent Publication No. 4-358310 has suggested a magneto-resistive sensor including a multi-layered structure having a non-magnetic metal layer, and two ferromagnetic layers sandwiching the non-magnetic metal layer therein. The two ferromagnetic layers are designed to have magnetization orientations which are perpendicular to each other when a magnetic field applied thereto has an intensity of zero. Since magnetization orientations are perpendicular to each other when an applied magnetic field is zero in intensity, the suggested magneto-resistive sensor has superior linearity in fluctuation in electrical resistance.

Japanese Unexamined Patent Publication No. 6-203340 has suggested a magneto-resistive sensor including a multi-layered structure having a non-magnetic metal layer, two ferromagnetic layers separated from each other by the non-magnetic metal layer, and an anti-ferromagnetic layer making contact with one of the ferromagnetic layers. The two ferromagnetic layers are designed to have magnetization orientations which are perpendicular to each other when a magnetic field of a signal has an intensity of zero.

Japanese Unexamined Patent Publication No. 7-262529 has suggested a magneto-resistive sensor including a multi-layered structure comprised of a first magnetic layer, a non-magnetic layer, a second magnetic layer, and an anti-ferromagnetic layer. The first and second magnetic layers are composed of CoZrNb, CoZrMo, FeSiAl, FeSi, NiFe alone or in combination of Cr, Mn, Pt, Ni, Cu, Ag, Al, Ti, Fe, Co or Zn.

Japanese Unexamined Patent Publication No. 10-92638 has suggested a magneto-resistive sensor including a multi-layered structure comprised of a non-magnetic substrate, a non-magnetic base layer, a magnetic layer, and a protection film. The non-magnetic base layer is comprised of a multi-layered structure including a first base layer composed of Ta, Ag or Al and a second base layer formed on the first base layer and composed of Cr or alloy of Cr. The magnetic layer is composed of an alloy predominantly containing Co.

In the above-mentioned MR sensors, a base layer is composed of Ta in order to enhance crystallinity of MR layer.

For instance, an example of MR sensor having a base layer composed of Ta is suggested in Abstract of 21st Japan Applied Magnetic Academy Conference, 1997, pp.26.

FIG. 1 is a cross-sectional view of a multi-layered structure of the spin-valve effect type MR sensor suggested in the Abstract. As illustrated in FIG. 1, the suggested MR sensor has a multi-layered structure including a base layer 2, a non-fixed magnetic layer 3, a non-magnetic layer 4, a fixed magnetic layer 5, a magnetization-bias layer 6, and a protection layer 7, deposited on a substrate 1 in this order. The base layer 2 is composed of Ta in order to enhance crystallinity of a portion of the multi-layered structure, comprised of the non-fixed magnetic layer 3, the non-magnetic layer 4, the fixed magnetic layer 5, and the magnetization-bias layer 6.

An apparatus for magnetically reproducing data, including such MR sensor as mentioned above, has been recently required to enhance reproduction output and improve a signal/noise ratio (S/N ratio). To this end, MR sensor has to be designed to have an enhanced resistance-change ratio and enhanced sensitivity.

However, if a base layer is composed of Ta, it is impossible to enhance a resistance-change ratio or MR rate. Hence, a base layer has to be composed of a material other than Ta. However, crystallinity of MR layer would be degraded, if a base layer were composed of a material other than Ta.

SUMMARY OF THE INVENTION

In view of the above-mentioned problem, it is an object of the present invention to provide a magneto-resistive sensor including MR layer having crystallinity which is superior to almost the same degree as crystallinity obtained when a base layer is composed of Ta, and enhancing a resistance-change rate (MR rate), even though MR layer is composed of a material other than Ta.

It is also an object of the present invention to provide a method of fabricating such MR sensor, and an apparatus for magnetically reproducing data, including such MR sensor.

In one aspect of the present invention, there is provided a magneto-resistive sensor including (a) a multi-layered structure including a base layer, a magnetic layer, and a non-magnetic layer, the magnetic and non-magnetic layers of being deposited on or above the base layer, the multi-layered structure having a sense region therein, and (b) a pair of electrode layers electrically connected to the sense region at its opposite sides, the electrode layers leading a sense current into the sense region at one side thereof and leading the sense current out of the sense region through the other side thereof, the magneto-resistive sensor detecting a magnetic field of a signal in accordance with fluctuation in a resistance in the sense region, the base layer being composed of zirconium (Zr) or alloy thereof.

For instance, the multi-layered structure may be comprised of (a) a first magnetic layer having magnetization an orientation of which varies in accordance with a magnetic field of a signal, (b) a non-magnetic layer, (c) a second magnetic layer having magnetization an orientation of which is not varied by the signal magnetic field, and (d) a magnetization-bias layer applying the magnetization to the second magnetic layer, the layers (a) to (d) being deposited on the base layer in this order or in the opposite order.

It is preferable that the magneto-resistive sensor further includes at least one magneto-resistance enhancing layer located adjacent to at least one of the first magnetic layer and the second magnetic layer.

For instance, a magneto-resistance enhancing layer may be sandwiched between the first magnetic layer and the non-magnetic layer. As an alternative, a magneto-resistance enhancing layer may be sandwiched between the non-magnetic layer and the second magnetic layer. The magneto-resistive sensor may be designed to include first and second magneto-resistance enhancing layers, in which case, the first magneto-resistance enhancing layer may be sandwiched between the first magnetic layer and the non-magnetic layer, and the second magneto-resistance enhancing layer may be sandwiched between the non-magnetic layer and the second magnetic layer.

The magneto-resistance enhancing layer may be composed of a material selected from a group consisting of Co, NiFeCo, FeCo, CoFeB, CoZrMo, CoZrNb, CoZr, CoZrTa, CoHf, CoTa, CoTaHf, CoNbHf, CoHfPd, CoTaZrNb, CoZrMoNi, and amorphous material.

It is preferable that the magneto-resistance enhancing layer has a thickness in the range of 0.5 nm to 5 nm both inclusive.

It is preferable that the magneto-resistive sensor further includes second magnetization-bias layers formed at opposite sides of the sense region, the second magnetization-bias layers applying magnetization to the first magnetic layer in a direction of the sense current, an orientation of the magnetization being varied in accordance with the signal magnetic field, each of the second magnetization-bias layers making contact with the first magnetic layer.

It is preferable that the alloy of zirconium contains at least one of Ta, Hf, W, Cr, Ti, Mo, Pt, Ni, Ir, Cu, Ag, Co, Zn, Ru, Rh, Re, Au, Os, Pd, Nb and V.

It is preferable that an interface between the base layer and the magnetic or non-magnetic layer, an interface between the base layer and the first magnetic layer, and an interface between the base layer and the magnetization-bias layer all have roughness equal to or smaller than 2 nm.

It is also preferable that an interface between the base layer and the magnetic or non-magnetic layer, an interface between the base layer and the first magnetic layer, and an interface between the base layer and the magnetization-bias layer all have mirror reflectivity equal to or greater than 0.1, more preferably, 0.2.

It is preferable that the magneto-resistive sensor further includes (a) a lower gap layer formed below the multi-layered structure, (b) a lower shield layer formed below the lower gap layer, (c) an upper gap layer formed on the multi-layered structure, and (d) an upper shield layer formed on the upper gap layer.

There is further provided a magneto-resistive sensor including (a) a substrate, (b) a lower shield layer formed on the substrate, (c) a lower gap layer formed on the lower shield layer and composed of electrically insulating material, (d) a magneto-resistive element formed on the lower gap layer, (e) an insulating layer formed on the magneto-resistive element, (f) a pair of magnetization-bias layers formed at opposite sides of the magneto-resistive element, (g) an upper gap layer formed over the magneto-resistive element and the magnetization-bias layers, and (h) an upper shield layer formed on the upper gap layer, the magneto-resistive element including (d1) a multi-layered structure including a base layer, a magnetic layer, and a non-magnetic layer, the magnetic and non-magnetic layers being deposited on or above the base layer, the multi-layered structure having a sense region therein, the magnetization-bias layers making electrical contact with the magnetic layer, the base layer being composed of zirconium (Zr) or alloy thereof, and (d2) a pair of electrode layers electrically connected to the sense region at its opposite sides, the electrode layers leading a sense current into the sense region at one side thereof and leading the sense current out of the sense region through the other side thereof, each of the electrode layers being formed on each of the magnetization-bias layers.

For instance, the lower and upper shield layers may be composed of a material selected from a group consisting of NiFe, CoZr, CoFeB, CoZrMo, CoZrNb, CoZrTa, CoHf, CoTa, CoTaHf, CoNbHf, CoHfPd, CoTaZrNb, CoZrMoNi, FeAlSi, and iron nitride.

It is preferable that the lower and upper shield layers have a thickness in the range of 0.3 to 10 μm.

It is preferable that the magnetization-bias layers and the electrode layers extend along the magneto-resistive element from its sidewall to its upper surface.

In another aspect of the present invention, there is provided a method of fabricating a magneto-resistive sensor, including the steps of (a) forming a base layer on a substrate so that the base layer has controlled roughness, the base layer being composed of zirconium (Zr) or alloy thereof, and (b) forming a multi-layered structure on the base layer, the multi-layered structure including at least a magnetic layer and a non-magnetic layer.

It is preferable that the base layer is formed through sputtering, and the roughness is controlled by varying a pressure of argon gas.

It is preferable that the roughness is controlled to be equal to or smaller than 2 nm in the step (a).

In still another aspect of the present invention, there is provided an apparatus for magnetically reproducing data, including (a) such a magneto-resistive sensor as mentioned above, (b) a head magnetically recording data into the medium, and formed on the magneto-resistive sensor, (c) a slider sliding on the medium, the magneto-resistive sensor and the head being fixed to the slider, and (d) a device moving the slider to thereby position the magneto-resistive sensor and the head at a predetermined region on the medium.

It is preferable that the head is comprised of (a) a coil generating lines of magnetic force when a current flows therethrough, and (b) lower and upper cores sandwiching the coil therebetween so that the lower and upper coils define a gap between them and the medium, the lower and upper cores directing the lines of magnetic force.

The advantages obtained by the aforementioned present invention will be described hereinbelow.

The inventor considered that the reason why MR sensor including a base layer composed of Ta could not have a high resistance-change ratio was that a base layer composed of Ta had a low mirror reflectivity. Hence, the inventor searched various materials which could provide a base layer with a high mirror reflectivity.

If a base layer were composed of a material having a high mirror reflectivity, other than Ta, crystallinity of MR layer was degraded. However, if a base layer were composed of zirconium (Zr) or an alloy containing Zr therein, it was possible to obtain MR layer having superior crystallinity.

However, if a film composed of Zr or alloy of Zr were deposited by sputtering in an ordinary condition, for instance, if such a film is used as a base layer in a multi-layered structure in a spin-valve effect type MR sensor, a resistance-change ratio in MR sensor is not increased. It was found that the reason why a resistance-change ratio is not increased in MR sensor including a base layer composed of Zr or alloy thereof was that since the base layer had a great surface-roughness, the mirror reflectivity of the base layer remained low in spite of zirconium having a high mirror reflectivity.

In order to overcome this problem, the inventor found out that a surface-roughness of a Zr film could be controlled by controlling a pressure of an argon (Ar) gas when a film composed of Zr or alloy thereof was deposited by sputtering.

In accordance with the results of the experiments the inventor conducted, when a base layer in a multi-layered structure in a spin-valve effect type MR sensor is composed of Zr or alloy thereof, the Zr base layer is designed to have a surface-roughness equal to or smaller than 2 nm. This ensures enhancement in crystallinity in MR layer.

In addition, a mirror reflectivity of conduction electrons is designed to be equal to or greater than 0.1, preferably, 0.2, thereby a resistance-change ratio can be significantly enhanced in comparison with a conventional base layer composed of Ta.

Furthermore, the above-mentioned MR sensor can be incorporated into an apparatus for magnetically reproducing data. This ensures enhancement in reproduction output and improvement in S/N ratio.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 16 is a cross-sectional view of MR layer in MR element in accordance with the first embodiment.

DESCRIPTION OF THE PREFERRED EMBODIMENTS

First Embodiment

First, hereinbelow are explained the experiments which the inventor had conducted in order to check whether a film composed of Zr or alloy thereof can be used as a base layer in MR layer having a multi-layered structure in a spin-valve effect type MR sensor.

The inventor had conducted the experiments in order to know a relation between a surface-roughness of a film composed of Zr or alloy thereof and a mirror reflectivity of the film, a relation between a surface-roughness of the film and a resistance-change ratio (MR rate) of MR sensor, and a relation between a process of forming a film of Zr or alloy thereof and a surface-roughness of a resultant film.

In addition, the inventor had conducted the experiment to compare MR rate of a base layer composed of Zr or alloy thereof to MR rate of a base layer composed of Ta.

(A) Relation between a surface-roughness and a mirror reflectivity, and a resistance-change ratio The inventor considered it important to enhance crystallinity of a magnetic layer in MR layer and enhance a mirror reflectivity at an interface between a base layer and a magnetic layer deposited on the base layer, in order to enhance a resistance-change ratio in MR sensor.

First, as to crystallinity of a magnetic layer, it was found out that if a base layer in MR sensor is composed of Zr or alloy thereof, a magnetic layer formed on the base layer could have almost the same crystallinity as that of a base layer composed of Ta. As to a mirror reflectivity at an interface between a base layer and a magnetic layer, since zirconium (Zr) has a higher mirror reflectivity of conduction electrons than that of tantalum (Ta), Zr has high possibility to be suitable for a material of which a base layer in MR layer in MR sensor is composed.

However, if a film is formed of Zr in accordance with an ordinary sputtering, the Zr film would have a greater surface-roughness than a film composed of Ta.

A mirror reflectivity of conduction electrons is influenced by a surface-roughness of a surface at which conduction electrons are reflected. Specifically, as a surface-roughness becomes greater, a mirror reflectivity becomes smaller. Thus, even if a base layer is composed of a material having a high mirror reflectivity, a surface-roughness of a resultant film becomes high in dependence on a process by which the film is formed, resulting in reduction in a mirror reflectivity. Accordingly, it would be necessary to compose a base layer of a material having possibility to enhance a mirror reflectivity, such as Zr, and enhance planarization of a resultant film. This will ensure to accomplish a mirror reflectivity which a material inherently has.

Under such concept as mentioned above, hereinbelow is explained the results of the experiments which the inventor conducted to find a relation between a surface-roughness and both a resistance-change ratio and a mirror reflectivity.

Figure 1:
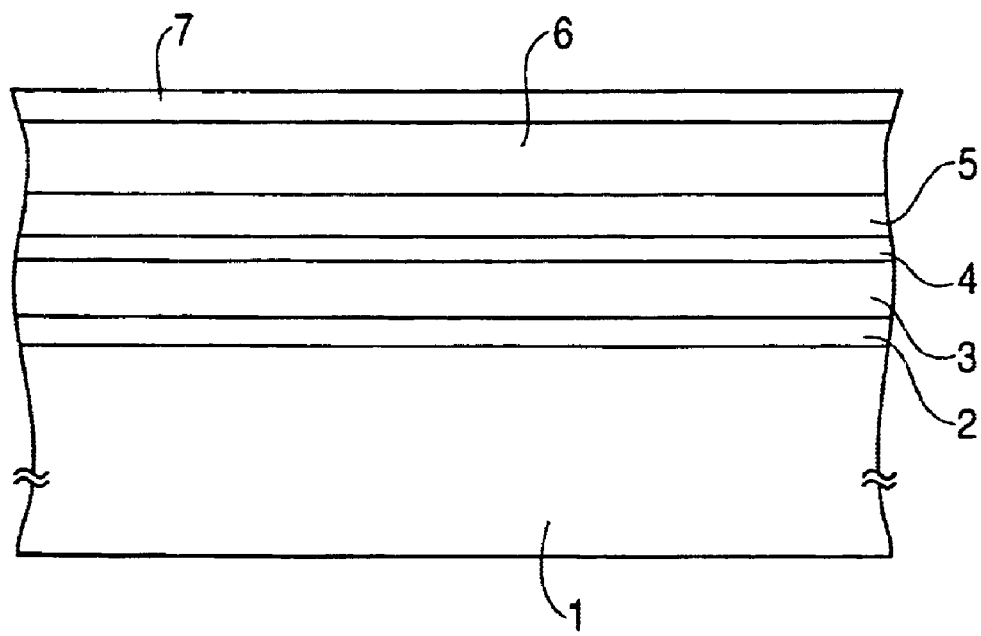
FIG. 1 is a cross-sectional view of MR layer in a conventional spin-valve effect type MR sensor.
Figure 2:
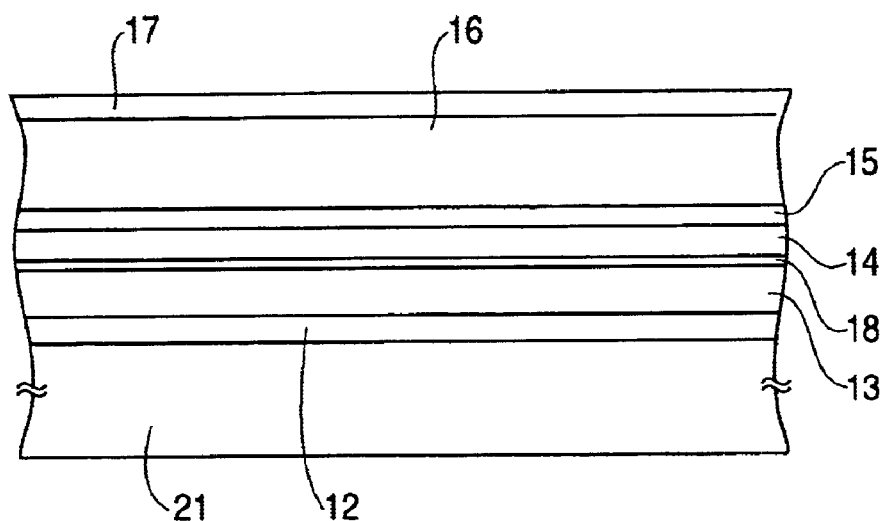
FIG. 2 is a cross-sectional view of MR layer in a spin-valve effect type MR sensor, used as an example for checking whether a film composed of Zr or alloy thereof can be used as a base layer.

FIG. 2 is a cross-sectional view of MR layer having a multi-layered structure in MR sensor having been used in the experiments. The illustrated multi-layered structure is one to be incorporated in a spin-valve effect type MR sensor.

As illustrated in FIG. 2, the multi-layered structure is formed on a glass substrate 21. The multi-layered structure is comprised of a base layer 12 composed of Zr and having a thickness of X nm, a non-fixed magnetic layer 13 composed of NiFe and having a thickness of 6 nm, a first magneto-resistance enhancing layer 18 composed of CoFe and having a thickness of 1 nm, a non-magnetic layer 14 composed of Cu and having a thickness of 2.7 nm, a fixed magnetic layer 15 composed of CoFe and having a thickness of 3 nm, a first magnetization-bias layer 16 composed of PtMn and having a thickness of 25 nm, and a protection layer 17 composed of Zr and having a thickness of 3 nm. The layers are deposited on the glass substrate 21 in this order.

Though not illustrated, MR sensor further includes a pair of electrodes at opposite ends of the protection layer 17. One of the electrodes introduces a sense current into the multi-layered structure, and the other electrodes lead the sense current out of the multi-layered structure.

In the experiment, eight examples were made. Each of the examples had the multi-layered structure as illustrated in FIG. 2, and the Zr base layer 12 in each of the examples was designed to have a thickness varying from 1 nm to 8 nm by 1 nm. After the multi-layered structures in the examples were formed, they were heated at 250 degrees centigrade for 5 hours.

In the experiment, a resistance-change ratio was measured in each of the examples while a sense current was being flown in the multi-layered structure through the electrodes, and an external magnetic field was being applied to the multi-layered structure.

Figure 3:
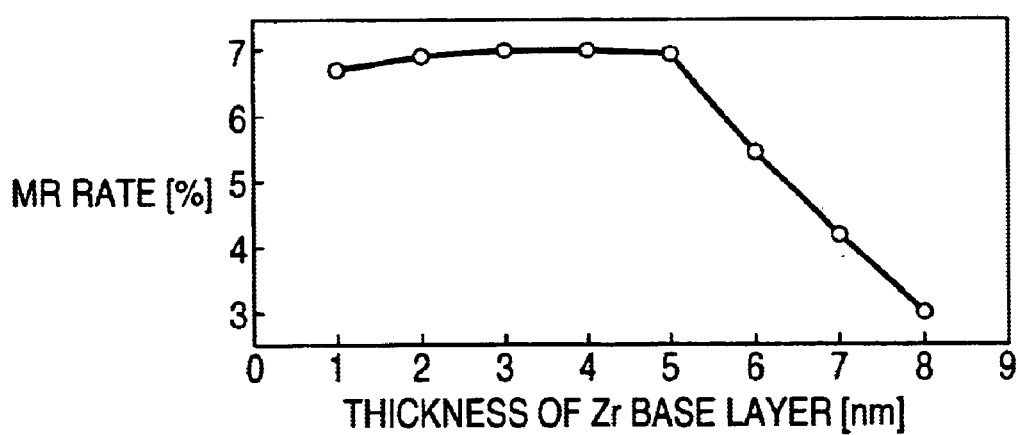
FIG. 3 is a graph showing the dependency of MR ratio on a thickness of a Zr base layer.

The results of the experiment is shown in FIG. 3. In FIG. 3, the axis of ordinate indicates MR ratio in the unit of % with linear scale, and the axis of abscissa indicates a thickness of the Zr base layer 12 in the unit of nanometer (nm) with linear scale.

As is obvious in view of FIG. 3, when the thickness X of the Zr base layer 12 is equal to or smaller than 5 nm, MR ratio is kept almost constant at about 7%. In contrast, when the thickness X of the Zr base layer 12 is beyond 5 nm, MR ratio is abruptly decreased. When the thickness X of the Zr base layer 12 is equal to 8 nm, MR ratio is equal to or smaller than 3%.

Figure 4:
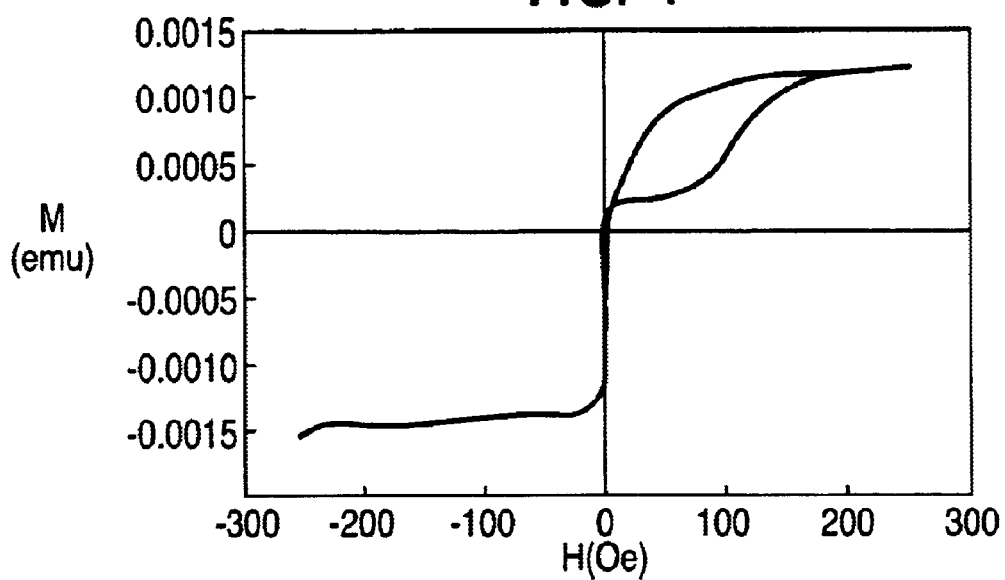
FIG. 4 is a graph showing a relation between M (emu) and H (Oe) when a Zr base layer is 3 nm thick.

FIG. 4 is a graph showing M-H characteristic observed when the Zr base layer 12 has a thickness X of 3 nm. In FIG. 4, the axis of ordinate indicates magnetization (M) in the unit of emu, and the axis of abscissa indicates an intensity of a magnetic field (H) in the unit of Oe.

As is obvious in view of FIG. 4, an inverted magnetic field has two stages, which is one of characteristics of a spin-valve effect type MR sensor.

Figure 5:
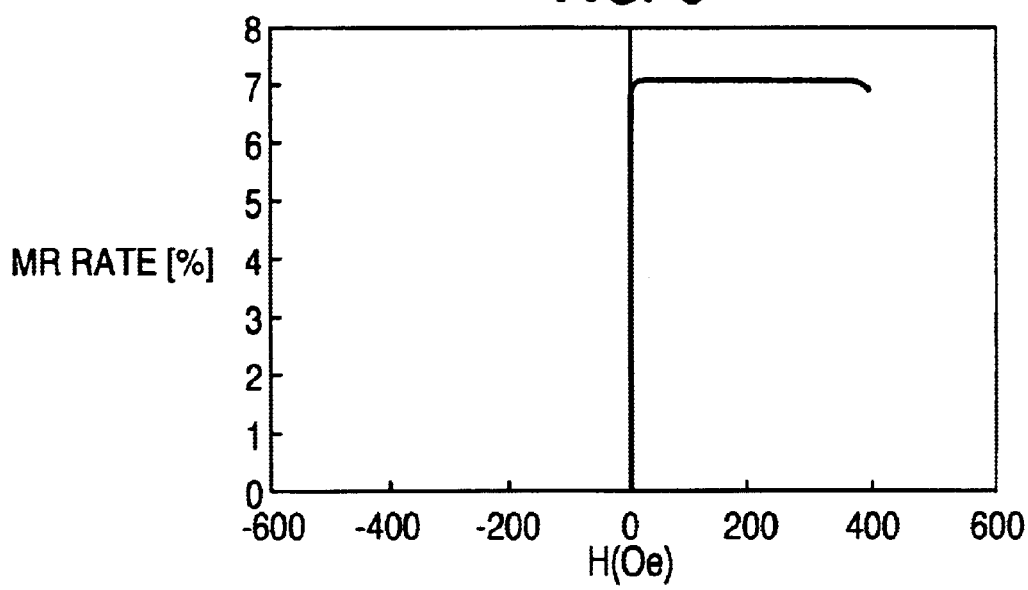
FIG. 5 is a graph showing a relation between MR ratio and H (Oe) when a Zr base layer is 3 nm thick.

FIG. 5 is a graph showing MR ratio-H characteristic in the same examples as those of FIG. 4. In FIG. 5, the axis of ordinate indicates MR ratio in the unit of %, and the axis of abscissa indicates an intensity of a magnetic field (H) in the unit of Oe.

FIG. 5 shows that the resistance-change ratio or MR rate is equal to about 7%.

Thus, the inventor considered that the reason why the resistance-change ratio was decreased as a thickness of the Zr base layer was increased was that as a thickness of the Zr base layer 12 was increased, a surface-roughness at an interface between the Zr base layer 12 and the non-fixed magnetic layer 13 was increased.

Figure 6:
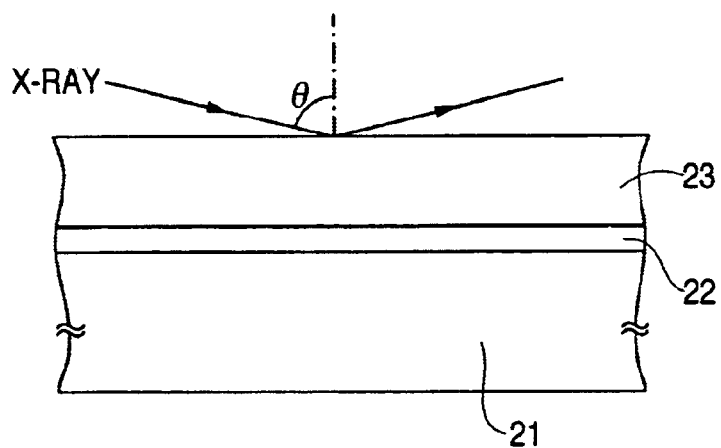
FIG. 6 is a cross-sectional view of a sample used for determining a surface-roughness of a base layer.

Then, in order to prove the above-mentioned consideration true, the inventor established a process of determining a surface-roughness, and found out a relation between a thickness of the Zr base layer and the surface-roughness thereof First, as illustrated in FIG. 6, there was made an example comprised of a glass substrate 21, and a multi-layered structure formed on the glass substrate 21 and including a base layer 22 composed of Zr and a non-fixed magnetic layer 23 composed of NiFe. A surface-roughness of the example was measured.

The surface-roughness of the example was measured through a process of measuring a surface-roughness by monitoring X-ray reflectance. In this process, X-ray is emitted to a surface of an example at quite a low angle, and reflected. A surface-roughness is measured by detecting a profile of an intensity of the reflected X-ray at an angle greater than a critical angle at which X-ray is totally reflected.

Then, by simulation-fitting the obtained profile data about an intensity of reflected X-ray, it is possible to obtain real number and imaginary number in a reflection coefficient, that is, material constants such as density and absorption coefficient. Thus, there is obtained data about the example such as a thickness, a surface-roughness, and a density.

In the simulation, there was used Maxwell equation for an electric field, and a surface-roughness, a density gradient, and a surface-roughness gradient were calculated in accordance with Nevot-Croce process.

Figure 7:
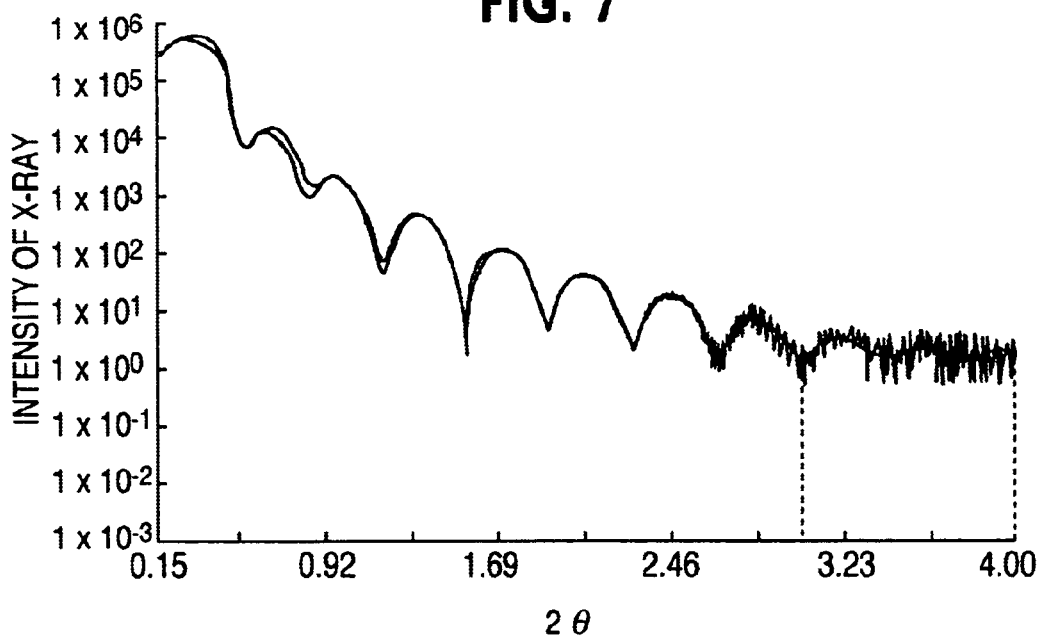
FIG. 7 is a graph showing the results of the experiment carried out for determining a surface-roughness of a base layer by detecting X-ray reflectance.

FIG. 7 is a graph showing the measurement results of the profile of an intensity of reflected X-ray in the two-layered structure comprised of the film 22 composed of Zr and having a thickness of 3 nm and the film 23 composed of NiFe and having a thickness of 10 nm. In FIG. 7, the axis of ordinate indicates an intensity of X-ray with logarithmic scale, and the axis of abscissa indicates a doubled angle 2 θ with linear scale wherein θ indicates an incident angle of X-ray.

Table 1 shows a thickness, a surface-roughness, and a density of each of the layers, obtained by simulation-fitting the profile.

TABLE 1

| | Thickness [Å] | Surface-roughness[Å] | Density [g/cc] |
|---|---|---|---|
| Glass substrate | — | 4.0 | 2.2 |
| Oxide layer | 15.6 | 3.0 | 5.6 |
| Zr layer | 16.0 | 12.0 | 6.0 |
| Mixture layer | 8.0 | 12.0 | 7.0 |
| NiFe layer | 90.0 | 12.0 | 8.1 |
| Oxide layer | 9.0 | 4.0 | 4.8 |

In Table 1, an oxide layer as a lower layer is composed of oxide of Zr. That is, the lower layer is resulted from reaction between oxygen contained in the glass substrate 21 and zirconium contained in the film 22. An oxide layer as an upper layer is resulted from combination of Ni or Fe contained in the NiFe film 23 with oxygen contained in the air. A mixture layer is a layer in which Zr contained in the Zr film 22 and Ni and Fe both contained in the NiFe film 23 are diffused each other.

A reason why actual thicknesses of the Zr film 22 and the NiFe film 23 are different from intended thicknesses is that the Zr film 22 and the NiFe film 23 are partially converted into the oxide layer and the mixture layer.

Then, there were made examples of the two-layered structure including the Zr film 22 and the NiFe film 23. The Zr films 22 in the examples were designed to have various thicknesses. A relation between a thickness and a surface-roughness in the Zr film 22 was analyzed through the above-mentioned process of obtaining a profile of an intensity of reflected X-ray.

Figure 8:
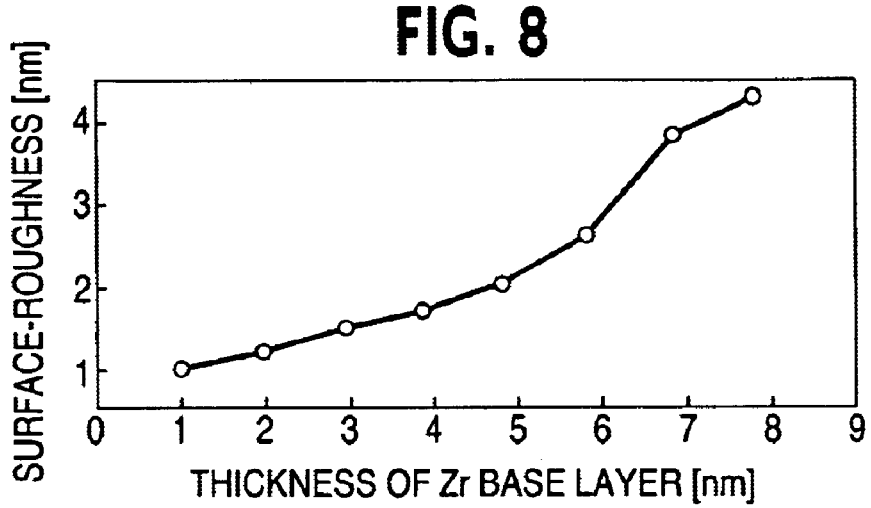
FIG. 8 is a graph showing the dependency of a surface-roughness on a thickness of a Zr base layer.

FIG. 8 shows the results of the experiment. In FIG. 8, the axis of ordinate indicates a surface-roughness in the unit of nanometer (nm) with linear scale, and the axis of abscissa indicates a thickness of the Zr base layer 22 in the unit of nanometer (nm) with linear scale.

As is obvious in view of FIG. 8, the surface-roughness is suddenly increased as a thickness of the Zr base layer 22 increases when a thickness of the Zr base layer 22 is over about 5 nm.

Figure 9:
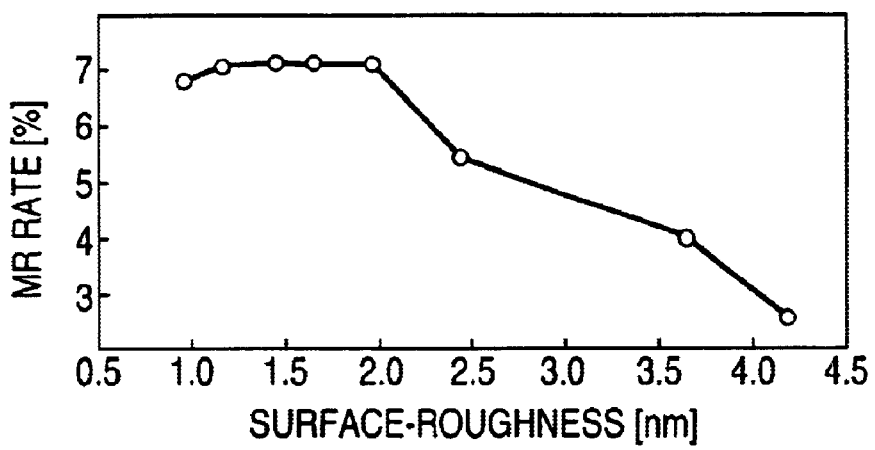
FIG. 9 is a graph showing the dependency of MR ratio on a surface-roughness of a base layer.

FIG. 9 is a graph showing a relation between a surface-roughness and MR rate or a resistance-change ratio. In FIG. 9, the axis of ordinate indicates MR rate in the unit of percent (%) with linear scale, and the axis of abscissa indicates a surface-roughness in the unit of nanometer (nm) with linear scale.

FIGS. 3 and 8 are rewritten into FIG. 9 to thereby show a relation between a surface-roughness and MR rate or a resistance-change ratio. In accordance with FIG. 9, MR rate is kept constant when the surface-roughness is equal to or smaller than 2 nm, but is abruptly decreased when the surface-roughness is over about 2 nm. This is considered because a mirror reflectivity at an interface between the Zr film 22 and the NiFe film 23 is reduced as the surface-roughness of the Zr film 22 is increased.

There was conducted an experiment to obtain a relation between a surface-roughness at an interface between the Zr film 22 and the NiFe film 23 and a mirror reflectivity. To this end, a relation between a thickness "d" of the NiFe film 23 and resistivity ρ of the NiFe film 23 was obtained through the use of the surface-roughness at an interface between the Zr film 22 and the NiFe film 23 as a parameter.

Figure 10:
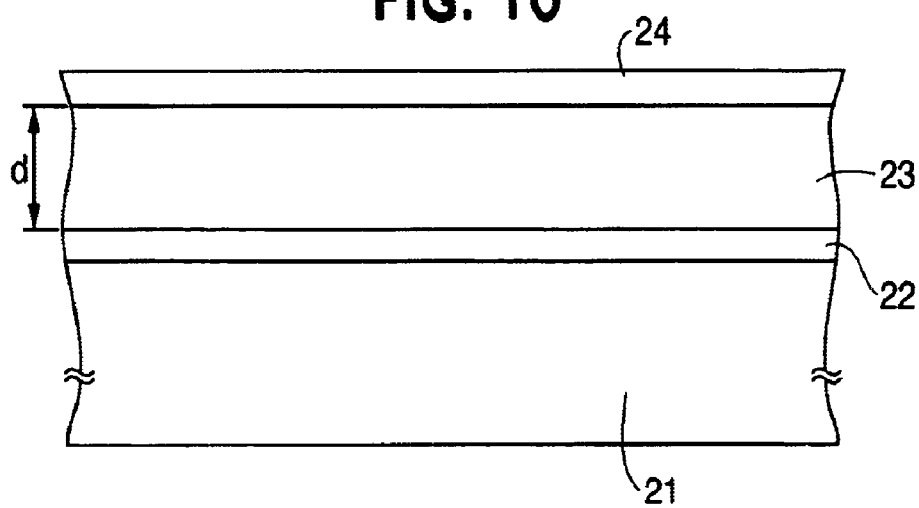
FIG. 10 is a cross-sectional view of a sample used for determining a relation between a thickness and a surface-roughness of a Zr base layer.

As an example to be used in the experiment, as illustrated in FIG. 10, there was formed a three-layered structure comprised of a film 22 composed of Zr and having a thickness of X nm, a film 23 composed of NiFe and having a thickness of "d" nm, and a film 24 composed of Zr and having a thickness of 3 nm.

The three-layered structure is formed on a glass substrate 21. The thickness X of the Zr film 22 underlying the NiFe film 23 was varied so that a surface-roughness at an interface between the Zr film 22 and the NiFe film 23 is equal to 1 nm and 3 nm. In addition, the thickness "d" of the NiFe film 23 was varied in each of cases where the surface-roughness was equal to 1 nm and 3 nm.

Figure 11:
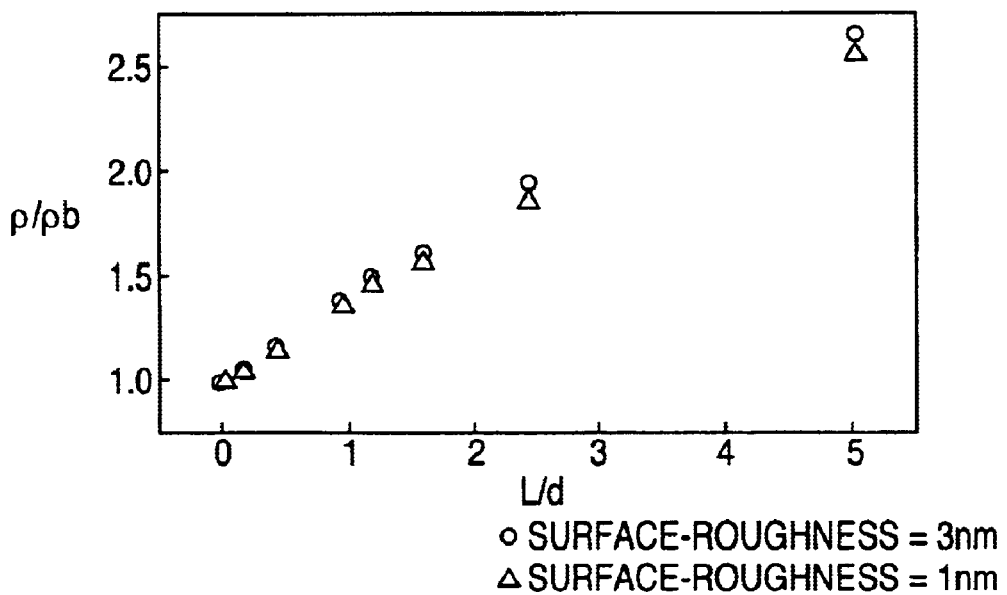
FIG. 11 is a graph showing the dependency of resistivity on a thickness in a NiFe film formed on a Zr base layer, with the surface-roughness being used as a parameter.

Resistivity ρ was measured for all examples. The results of the measurement are shown in FIG. 11. In FIG. 11, the axis of ordinate indicates a resistivity ratio ρ/ρb of the multi-layered structure with linear scale, and the axis of abscissa indicates L/d wherein "d" indicates a thickness of the NiFe film 23 in the unit of nanometer and L indicates mean free path of electrons in the unit of nanometer. In FIG. 11, marks Δ indicate examples where the surface-roughness is equal to 1 nm, and marks ○ indicate examples where the surface-roughness is equal to 3 nm. Herein, "ρb" indicates resistivity of the multi-layered structure when the NiFe film 23 has a sufficiently great thickness, specifically, a thickness equal to or greater than 100 nm.

As is obvious in view of FIG. 11, higher resistivity ρ is associated with a higher surface-roughness, and higher resistivity ρ is associated with a smaller thickness "d" of the NiFe film 23.

The inventor estimated a mirror reflectivity based on both the actually measured values as mentioned above and theoretical analysis mentioned hereinbelow.

Collision of electrons to a surface of a thin metal film has been theorized by Fuchs in 1938 on the basis of the free electron model, and has been studied in 1970s. If metal is formed smaller in size than mean free path of electrons, a lot of electrons would collide to a surface of the metal. Based on the free electron model, resistivity of a single-layered thin film having a thickness of "d" is represented by the following equations (1) to (3).

$$\rho(d) = \rho b (f(\kappa)/\kappa) \quad (1)$$

$$\frac{1}{f(\kappa)} = \frac{1}{\kappa} - \frac{3(1-p)}{2\kappa^2} \int_1^\infty \frac{1}{(x^3 - x^5)} \cdot \frac{(1 - e^{-\kappa x})}{(1 - pe^{-\kappa x})} dx \quad (2)$$

$$\kappa = d/L \quad (3)$$

In the equation (2), "p" indicates a mirror reflection coefficient.

When the mirror reflection coefficient "p" is equal to zero, there occurs diffuse scattering where electrons lose their memory by diffusion, and hence, do not contribute to conduction. On the other hand, when the mirror reflection coefficient "p" is equal to one, electrons are perfectly mirror-diffused. Since movement of electrons in a direction in which a current runs is reserved, an electrical resistance is not increased, even if electrons collide with a surface of a thin metal film.

The inventor varied the mirror reflection coefficient "p" to thereby determine such a mirror reflection coefficient "p" that a relation between "ρ/ρ b" and "κ" in the equation (1) is coincident with the relation illustrated in FIG. 11.

Figure 12:
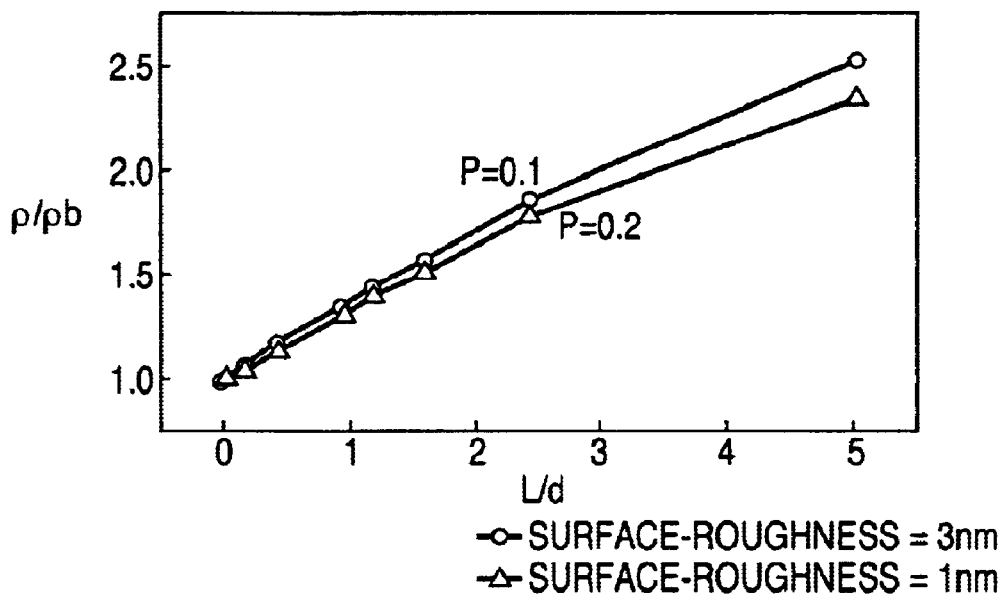
FIG. 12 is a graph showing a mirror reflectivity determined by simulation fitting on the basis of the results illustrated in FIG. 11.

The results are shown in FIG. 12. FIG. 12 has the same axes of ordinate and abscissa as those of FIG. 11. In FIG. 12, marks Δ indicate examples where the surface-roughness is equal to 1 nm, and marks ○ indicate examples where the surface-roughness is equal to 3 nm.

In accordance with FIG. 12, the mirror reflection coefficient "p" is equal to 0.1 when the surface-roughness is equal to 3 nm, and the mirror reflection coefficient "p" is equal to 0.2 when the surface-roughness is equal to 1 nm. Thus, the reason why the resistance-charge ratio is reduced when the surface-roughness is relatively high in MR sensor is considered that the mirror reflection rate at a surface of the film is reduced due to the surface-roughness at an interface between the films.

Based on the above-mentioned analysis, it is found out that the reason why MR rate is reduced when a surface-roughness increases is that a mirror reflectivity is reduced due to an increase of a surface-roughness. Accordingly, it is important to reduce a surface-roughness of the Zr base layer 22 in order to enhance MR rate.

As to planarization of the Zr base layer 22, it is preferable to design a surface-roughness of the Zr base layer 22 to be equal to or smaller than 3 nm, more preferably, 2 nm in order to enhance MR rate, as illustrated in FIG. 9. As an alternative, as illustrated in FIGS. 11 and 12, it is preferable to design a mirror reflectivity of the Zr base layer 22 to be equal to or greater than 0.1, more preferably, 0.2.

Based on the above-mentioned analysis, it was found that a thickness of the Zr base layer is in proportion to a surface-roughness, as illustrated in FIG. 8. As mentioned later, an absolute value of a surface-roughness can be controlled in dependence on a process through which a Zr base layer is formed and/or conditions under which a Zr base layer is formed.

(B) Relation between process/condition for forming a Zr base layer, and a surface-roughness and MR rate.

The inventor conducted the experiment to analyze a relation between a surface-roughness and MR rate of a Zr base layer, and a process through which the Zr base layer is formed and conditions under which the Zr base layer is formed. In the experiment, an argon (Ar) gas pressure was varied in deposition of a Zr base layer by sputtering, and monitored how a surface-roughness and MR rate were varied.

As an example, there was used the multi-layered structure illustrated in FIG. 6. The used multi-layered structure is comprised of a film 22 composed of Zr and having a thickness of 3 nm and a film 23 composed of NiFe and having a thickness of 10 nm. The multi-layered structure is formed on the glass substrate 21 by sputtering. An argon gas pressure was varied from 1 mTorr to 5 mTorr by 1 mTorr, and examples were made under each of the pressures of an argon gas. A surface-roughness and MR rate of the Zr base layer 22 were measured for each of the thus made examples.

Hereinbelow, the term "surface-roughness" means a surface-roughness of a single-layered Zr film, and the term "interface-roughness" means a surface-roughness of a Zr film on which other layer such as a NiFe film is formed. Though the terms "surface-roughness" and "interface-roughness" are different from each other in expression, they are identical with each other in content.

Figure 13:
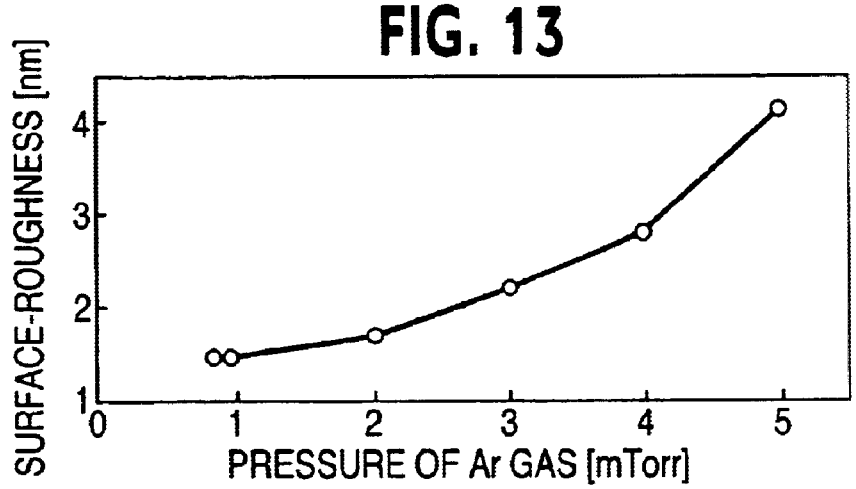
FIG. 13 is a graph showing a relation between a pressure of argon gas and a surface-roughness in deposition of a Zr base layer by sputtering.

FIG. 13 is a graph showing the results of the experiment having been conducted to determine a relation between a surface-roughness of a Zr base layer and an Ar gas pressure in deposition of the Zr base layer. In FIG. 13, the axis of ordinate indicates a surface-roughness in the unit of nanometer with linear scale, and the axis of abscissa indicates a pressure of Ar gas in the unit of mTorr with linear scale.

As is obvious in view of FIG. 13, the surface-roughness is equal to 1 nm when the Ar gas pressure is equal to 1 mTorr. As the Ar gas pressures increases, the surface-roughness gradually increases, and when the Ar gas pressure reaches 5 mTorr, the surface-roughness reaches about 4 nm.

Figure 14:
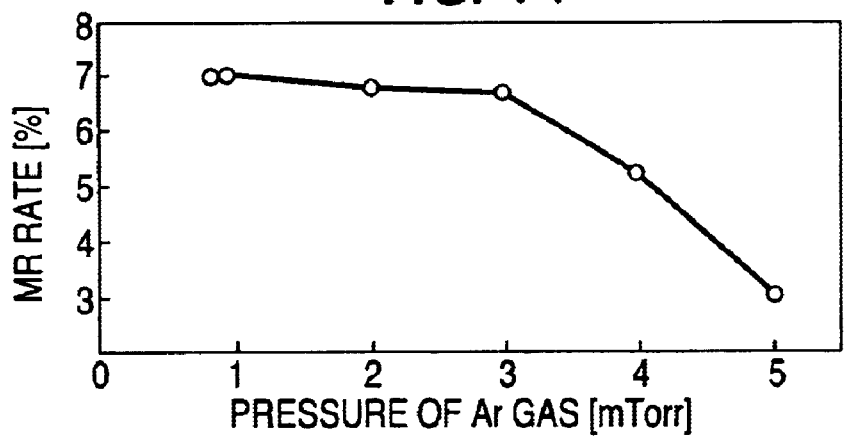
FIG. 14 is a graph showing a relation between a pressure of argon gas and MR ratio in deposition of a Zr base layer by sputtering.

FIG. 14 is a graph showing the results of the experiment having been conducted to determine a relation between MR rate and an Ar gas pressure in deposition of the Zr base layer. In FIG. 14, the axis of ordinate indicates MR rate in the unit of percent (%) with linear scale, and the axis of abscissa indicates a pressure of Ar gas in the unit of mTorr with linear scale.

As is obvious in view of FIG. 14, MR rate is equal to about 7% when the Ar gas pressure is equal to 1 mTorr, and is kept equal to about 7% until the Ar gas pressure reaches 3 mTorr. After the Ar gas pressure has reached 3 mTorr, as the Ar gas pressures increases, MR rate gradually decreases, and when the Ar gas pressure reaches 5 mTorr, MR rate reaches about 3%.

Figure 15:
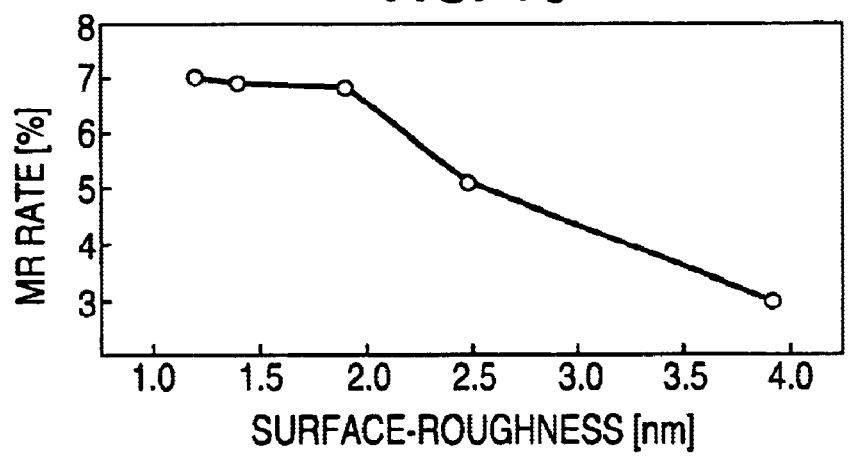
FIG. 15 is a graph showing a relation between a surface-roughness and MR ratio in deposition of a Zr base layer by sputtering.

FIG. 15 is a graph showing a relation between a surface-roughness of the Zr base layer and MR rate. FIG. 15 is made by rewriting data illustrated in FIGS. 13 and 14. In FIG. 15, the axis of ordinate indicates MR rate in the unit of percent (%) with linear scale, and the axis of abscissa indicates a surface-roughness in the unit of nanometer with linear scale.

As is obvious in view of FIG. 15, MR rate is equal to about 7% when the surface-roughness is equal to 1 mTorr, and is kept equal to about 7% until the surface-roughness reaches 2 nanometer. After the surface-roughness has reached 2 nanometer, as the surface-roughness increases, MR rate gradually decreases, and when the surface-roughness reaches 4 nm, MR rate reaches about 3%.

Based on the above-mentioned results of the experiments, it was found out that a surface-roughness of a Zr base layer can be controlled by a process through which the Zr base layer is formed and/or conditions under which the Zr base layer is formed, in particular, by a pressure of Ar gas in deposition of the Zr base layer by sputtering. It was also found out that a Zr base layer could be designed to have a surface-roughness equal to or smaller than 3 nm, and further, 2 nm.

(C) Comparison between MR layer having a Zr base layer and MR layer having a Ta base layer The inventor conducted the experiment to compare MR rates or resistance-change ratios between MR layer having a base layer composed of Zr and MR layer having a base layer composed of Ta. In the experiment, there was employed MR layer having a multi-layered structure formed on a glass substrate and comprised of a base layer having a thickness of X nm, a film composed of $Ni_{82}Fe_{18}$ and having a thickness of 8 nm, a film composed of $Co_{90}Fe_{10}$ and having a thickness of 1 nm, a film composed of Cu and having a thickness of 2.1 nm, a film composed of $Co_{90}Fe_{10}$ and having a thickness of 3 nm, a film composed of $Pt_{46}Mn_{54}$ and having a thickness of 25 nm, and a film composed of Zr and having a thickness of 3 nm. The comparison of a resistance-change ratio or MR rate was made with anti-ferromagnetic material of which a magnetization-bias layer is composed being varied.

A thickness of the Zr base layer was designed to be equal to 1 nm or 3 nm. The surface-roughness of the Zr base layer was equal to 1.2 nm and 1.6 nm, respectively. On the other hand, a thickness of a Ta base layer was fixed to be 3 nm. The surface-roughness of the Ta base layer was equal to 0.7 nm.

Table 2 shows a resistance-change ratio or MR rate of each of examples having a magnetization-bias layer composed of PtMn which is one of anti-ferromagnetic materials. After deposition of the magnetization-bias layer, the examples were heated at 250 degrees centigrade for 5 hours, and a magnetic field having an intensity of 500 Oe was applied to the examples.

TABLE 2

| Base Layer | Thickness (nm) | Surface-roughness (nm) | MR rate |
|---|---|---|---|
| Zr | 1 | 1.2 | 6.6 |
| Zr | 2 | 1.2 | 6.8 |
| Zr | 3 | 1.2 | 7.0 |
| Zr | 3 | 1.6 | 6.5 |
| Ta | 3 | 0.7 | 5.0 |

In Table 2, the Ta base layer is shown as a conventional example for comparison with the Zr base layers.

Table 3 shows a resistance-change ratio or MR rate of each of examples having a magnetization-bias layer composed of FeMn which is one of anti-ferromagnetic materials. Heat treatment was not conducted in these examples after deposition of the magnetization-bias layer.

TABLE 3

| Base Layer | Thickness (nm) | Surface-roughness (nm) | MR rate |
|---|---|---|---|
| Zr | 1 | 1.2 | 7.2 |
| Zr | 2 | 1.2 | 7.8 |
| Zr | 3 | 1.2 | 8.4 |
| Zr | 3 | 1.6 | 7.1 |
| Ta | 3 | 0.7 | 5.5 |

In Table 3, the Ta base layer is shown as a conventional example for comparison with the Zr base layers.

Table 4 shows a resistance-change ratio or MR rate of each of examples having a magnetization-bias layer composed of NiMn which is one of anti-ferromagnetic materials. After deposition of the magnetization-bias layer, the examples were heated at 270 degrees centigrade for 5 hours, and a magnetic field having an intensity of 500 Oe was applied to the examples.

TABLE 4

| Base Layer | Thickness (nm) | Surface-roughness (nm) | MR rate |
|---|---|---|---|
| Zr | 1 | 1.2 | 5.2 |
| Zr | 2 | 1.2 | 5.5 |
| Zr | 3 | 1.2 | 5.6 |
| Zr | 3 | 1.6 | 5.2 |
| Ta | 3 | 0.7 | 4.4 |

In Table 4, the Ta base layer is shown as a conventional example for comparison with the Zr base layers.

As mentioned above, in all the examples where a magnetization-bias layer is composed of three different anti-ferromagnetic materials, the Zr base layer could significantly enhance MR rate in comparison with the Ta base layer.

Thus, when a base layer in MR layer in MR sensor is composed of Zr, it would be possible to enhance crystallinity of MR layer, accomplish a planarized surface to thereby enhance a mirror reflectivity and thus provide a higher MR rate than that of a Ta base layer, by selecting a process through which a Zr base layer is formed and conditions under which a Zr base layer is formed. Thus, it is confirmed that a film composed of Zr is suitable for a base layer of MR layer in MR sensor.

It should be noted that a film composed of an alloy containing Zr therein may be used as a base layer in MR layer in MR sensor, since such a film has the same characteristics as that of a film composed of Zr with respect to crystallinity of layers to be formed above a base layer and a mirror reflectivity. For instance, an alloy predominantly containing Zr therein may contain at least one of Ta, Hf, W, Cr, Ti, Mo, Pt, Ni, Ir, Cu, Ag, Co, Zn, Ru, Rh, Re, Au, Os, Pd, Nb and V.

Second Embodiment

FIG. 16 is a cross-sectional view illustrating a magneto-resistive element (hereinafter, referred to simply as "MR element") to be used in MR sensor, in accordance with the second embodiment of the present invention.

The illustrated MR element 121 is comprised of, as illustrated in FIG. 16, a substrate 11, a base layer 12, a non-fixed magnetic layer 13 having magnetization an orientation of which is varied in accordance with a signal magnetic field, a non-magnetic layer 14, a fixed magnetic layer 15 having magnetization an orientation of which is not varied by a signal magnetic field, a first magnetization-bias layer 16 applying bias magnetization to the fixed magnetic layer 15, and a protection layer 17. The layers 12 to 17 are deposited on the substrate 11 in this order.

The substrate 11 may be composed of $Al_2O_3$ TiC, SiC, alumina, $Al_2O_3$ TiC/alumina, or $Al_2O_3$ TiC/SiC.

The base layer 12 may be composed of Zr or an alloy containing Zr. The alloy containing Zr may include various elements, as mentioned earlier.

The non-fixed magnetic layer 13 may be composed of NiFe, CoFe, NiFeCo, FeCo, CoFeB, CoZrMo, CoZrNb, CoZr, CoZrTa, CoHf, CoTa, CoTaHf, CoNbHf, CoHfPd, CoTaZrNb, CoZrMoNi, or amorphous magnetic materials. The non-fixed magnetic layer 13 is designed to have a thickness preferably in the range of 1 nm to 10 nm.

The non-magnetic layer 14 may be composed of Cu, Cu containing Ag at 1 to 20 at%, Cu containing Re at 1 to 20 at%, or Cu-Au alloy. The non-magnetic layer 14 is designed to have a thickness preferably in the range of about 2 nm to about 4 nm.

The fixed magnetic layer 15 may be composed of Co, Ni, Fe or a magnetic alloy material predominantly containing at least one of Co, Ni and Fe. The fixed magnetic layer 15 is designed to have a thickness preferably in the range of about 1 nm to about 50 nm.

The magnetization-bias layer 16 may be composed of an anti-ferromagnetic material such as FeMn, NiMn, IrMn, RhMn, PtPdMn, ReMn, PtMn, PtCrMn, CrMn, CrAl, oxides of Ni, oxides of Fe, mixture of oxides of Ni and oxides of Co, mixture of oxides of Ni and oxides of Fe, a two-layered film composed of oxides of Ni and oxides of Co, and a two-layered film composed of oxides of Ni and oxides of Fe, a ferrimagnetic material such as TbCo, or a hard magnetic material such as CoCr, CoCrPt, CoCrTa and PtCo.

The protection layer 17 may be composed of metal, oxide, nitride, mixture of oxide and nitride, a two-layered film composed of metal and oxide, a two-layered film composed of metal and nitride, or a two-layered film composed of oxide and nitride. Specifically, the protection film 17 may be composed of a metal selected from a group consisting of Ti, V, Cr, Co, Cu, Zn, Y, Zr, Nb, Mo, Tc, Ru, Rh, Pd, Ag, Hf, Ta, W, Re, Os, Ir, Pt and Au, oxides or nitrides containing Si, Al, Ti or Ta, mixture of such oxides and nitrides, or a two-layered film composed of (a) one of the above-mentioned oxide, nitrides, and mixture of those, and (b) a metal selected from a group consisting of Ti, V, Cr, Co, Cu, Zn, Y, Zr, Nb, Mo, Tc, Ru, Rh, Pd, Ag, Hf, Ta, W, Re, Os, Ir, Pt and Au, or alloy thereof.

Since the MR element in accordance with the second embodiment, illustrated in FIG. 16, includes the base layer 12 composed of Zr or an alloy thereof, it would be possible to enhance crystallinity of MR layer and enhance a mirror reflectivity of conduction electrons above 0.1 to thereby significantly enhance MR rate in comparison with a base layer composed of Ta.

Figure 17A:
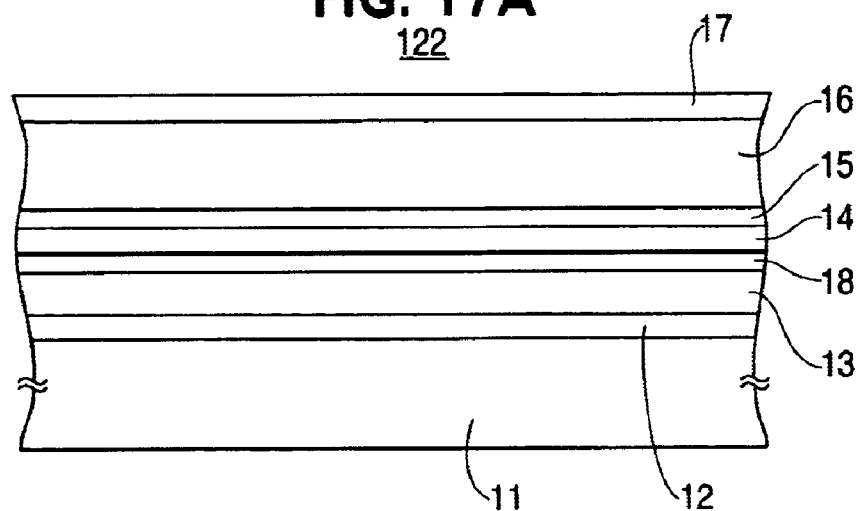
FIG. 17A is a cross-sectional view of MR layer in MR element in accordance with a first variant of the second embodiment.
Figure 17B:
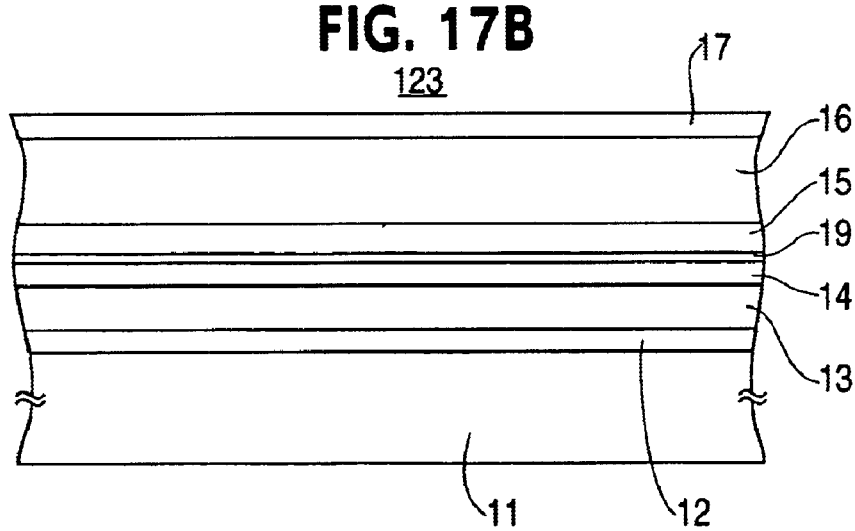
FIG. 17B is a cross-sectional view of MR layer in MR element in accordance with a second variant of the second embodiment.
Figure 17C:
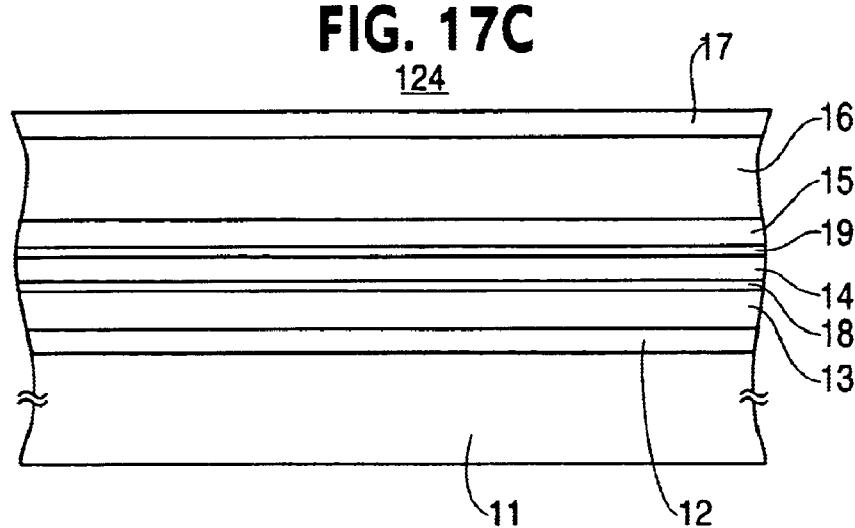
FIG. 17C is a cross-sectional view of MR layer in MR element in accordance with a third variant of the second embodiment.

FIGS. 17A, 17B and 17C are cross-sectional views illustrating various MR elements used in MR sensor in accordance with the second embodiment.

MR element 122 illustrated in FIG. 17A is structurally different from MR element illustrated in FIG. 16 in that a first MR enhancing layer 18 is sandwiched between the non-fixed magnetic layer 13 and the non-magnetic layer 14.

MR element 123 illustrated in FIG. 17B is structurally different from MR element illustrated in FIG. 16 in that a second MR enhancing layer 19 is sandwiched between the non-magnetic layer 14 and the fixed magnetic layer 15.

MR element 124 illustrated in FIG. 17C is structurally different from MR element illustrated in FIG. 16 in that a first MR enhancing layer 18 is sandwiched between the non-fixed magnetic layer 13 and the non-magnetic layer 14, and a second MR enhancing layer 19 is sandwiched between the non-magnetic layer 14 and the fixed magnetic layer 15.

The first and second MR enhancing layers 18 and 19 may be composed of Co, NiFeCo, FeCo, CoFeB, CoZrMo, CoZrNb, CoZr, CoZrTa, CoHf, CoTa, CoTaHf, CoNbHf, CoHfPd, CoTaZrNb, CoZrMoNi, or amorphous material.

The first and second MR enhancing layers 18 and 19 are designed to have a thickness preferably in the range of about 0.5 nm to about 5 nm.

In accordance with MR elements 122, 123 and 124 illustrated in FIGS. 17A to 17C, a MR enhancing layer is formed adjacent to the non-fixed magnetic layer 13 and/or the fixed magnetic layer 15. This structure ensures a higher MR rate than that of MR element illustrated in FIG. 16, having no MR enhancing layer.

Hereinbelow is explained MR sensor including the above-mentioned MR element.

Figure 18:
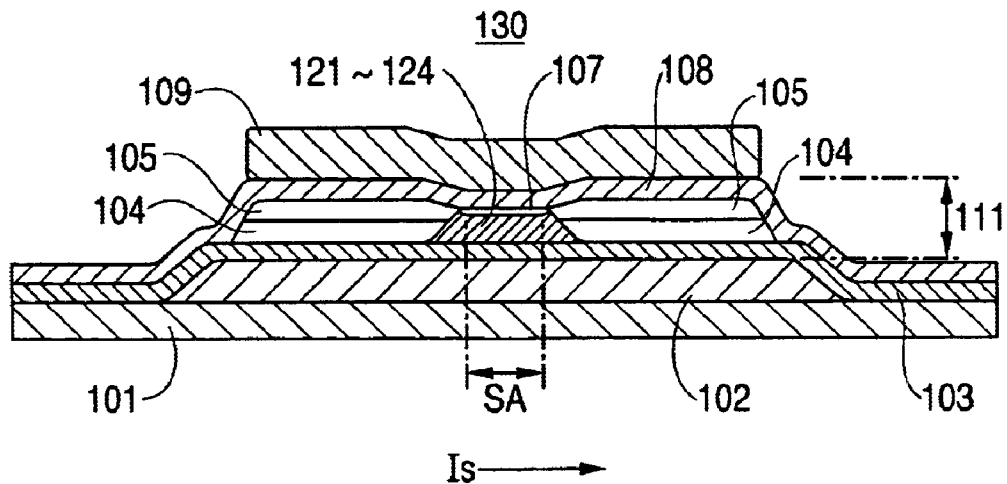
FIG. 18 is a cross-sectional view of MR sensor including MR element illustrated in FIGS. 17A to 17C.

FIG. 18 is a cross-sectional view illustrating MR sensor including MR element in accordance with the second embodiment.

As illustrated in FIG. 18, MR sensor 130 is comprised of a substrate 101, a lower shield layer 102 formed partially on the substrate 101, a lower gap layer 103 composed of electrically insulating material and formed covering the lower shield layer 102 and the substrate 101 therewith, MR element 121 illustrated in FIG. 16, formed on the lower gap layer 103 above the lower shield layer 102, vertical bias layers or second magnetization-bias layers 104 formed on the lower gap layer 103 at opposite ends of MR element 121 in a direction in which a sense current Is flows, electrode layers 105 formed on the second magnetization-bias layers 104, a gap-defining insulating layer 107 formed at a summit of MR element 121, an upper gap layer 108 composed of an electrically insulating material and covering the lower gap layer 103, the electrode layers 105, and the gap-defining insulating layer 107 therewith, and an upper shield layer 109 formed on the upper gap layer 108 above both the electrode layers 105 and MR element 121.

In place of MR element 121, there may be used MR element 122, 123 or 124 illustrated in FIGS. 17A, 17B or 17C.

The second magnetization-bias layers 104 make electrical contact with the non-fixed magnetic layer 13 of MR element 121. This ensures that an orientation of magnetization in the non-fixed magnetic layer 13 can be coincide with a direction in which a sense current Is flows, when a signal magnetic field is not applied to the non-fixed magnetic layer 13.

The magnetization-bias layer 16 fixes an orientation of magnetization in the fixed magnetic layer 15 to a direction perpendicular to a direction in which a sense current Is flows. This orientation of magnetization in the fixed magnetic layer 15 is not varied by the vertical bias layers 104. Hence, when a signal magnetic field is not applied, an orientation of magnetization of the non-fixed magnetic layer 13 is perpendicular to an orientation of magnetization of the fixed magnetic layer 15.

One of the electrode layers 105 introduces a sense current Is into MR element 121, and the other electrode layer 105 leads the sense current out of MR element 121. A region sandwiched between the electrode layers 105 defines a sense region SA of MR element 121.

A plane of MR sensor 130 in facing relation to a magnetically data-recording medium is in parallel with a plane of the drawing. A gap between the lower shield layer 102 and the upper shield layer 109 in the plane in facing relation to a magnetically data-recording medium defines a gap 111 through which data is read out. In this embodiment, the data-reading gap 111 is designed to be equal to 0.21 $\mu$m.

In the data-reading gap 111, an end surface of MR element 121 appears in a direction in which a sense current Is flows in the plane facing a magnetically data-recording medium.

The substrate 101 may be composed of $Al_2O_3$ TiC, SiC, alumina, $Al_2O_3$ TiC/alumina, or $Al_2O_3$ TiC/SiC, similarly to the substrate 11.

The lower and upper shield layers 102 and 109 may be composed of NiFe, CoZr, CoFeB, CoZrMo, CoZrNb, CoZrTa, CoHf, CoTa, CoTaHf, CoNbHf, CoHfPd, CoTaZrNb, CoZrMoNi, FeAlSi, or nitriding iron. The lower and upper shield layers 102 and 109 are designed to have a thickness preferably in the range of 0.3 nm to 10 $\mu$m both inclusive.

The lower gap layer 103, the gap-defining insulating layer 107 and the upper gap layer 108 may be composed of alumina, silicon dioxide ($SiO_2$), aluminum nitride, silicon nitride, or diamond-like carbon.

The lower and upper gap layers 103 and 108 are designed to have a thickness preferably in the range of about 0.01 $\mu$m to about 0.2 $\mu$m. The gap-defining insulating layer 107 is designed to have a thickness preferably in the range of about 0.005 $\mu$m to about 0.05 $\mu$m.

The vertical bias layer 104 may be composed of CoCr, CoCrPt, CoCrTa, CoPt, FeMn, NiMn, IrMn, PtPdMn, ReMn, PtMn, CrMn, oxides of Ni, oxides of Fe, mixture of oxides of Ni and oxides of Co, mixture of oxides of Ni and oxides of Fe, a two-layered film composed of oxides of Ni and oxides of Co, or a two-layered film composed of oxides of Ni and oxides of Fe.

The electrode layers 105 may be composed of Zr, Ta, Mo, an alloy containing at least one of Zr, Ta and Mo, or mixture thereof. The electrode layers 105 are designed to have a thickness preferably in the range of about 0.01 $\mu$m to about 0.1 $\mu$m.

Hereinbelow is explained a method of fabricating MR sensor 130, with reference to FIGS. 16, 17 and 18.

First, there is formed a substrate 101 by depositing alumina on $Al_2O_3$ TiC. Then, the lower shield layer 102 composed of NiFe is formed on the substrate 101. Then, the lower gap layer 103 composed of alumina is formed entirely covering the lower shield layer 102 and the substrate 101 therewith.

Then MR element 121, 122, 123 or 124 is formed on the lower gap layer 103.

For instance, MR element 122 illustrated in FIG. 17A is formed as follows. While a magnetic field having an intensity of 100 Oe is applied in a direction in which a sense current Is flows, there are successively deposited the base layer 12, the film 13 composed of NiFe and having a thickness of 6 nm, the film 18 composed of CoFe and having a thickness of 1 nm, the film 14 composed of Cu and having a thickness of 2.7 nm, the film 15 composed of CoFe and having a thickness of 3 nm, the film 16 composed of PtMn and having a thickness of 25 nm, and the film 17 composed of Zr and having a thickness of 3 nm, on the lower gap layer 103 corresponding to the substrate 11.

There were made examples of MR layer including the Zr base layer 12 having a thickness of about 3 nm and various surface-roughness. For reference, there was also made an example of MR layer including a Ta base layer and having a thickness of about 3 nm. The surface-roughness was varied by varying a pressure of argon gas in deposition of a base layer by sputtering. After deposition of the base layer, MR layer was heated at 250 degrees centigrade for 5 hours with a magnetic field having an intensity of 500 Oe being applied thereto in a direction perpendicular to a direction in which a magnetic field was applied in deposition of the base layer.

Then, the above-mentioned multi-layered structure is patterned through the use of a resist film as a mask, to thereby form MR element 121, 122, 123 or 124 shaped in 1×1$\mu$m square. Accordingly, a sense region SA has a length of 1 $\mu$m, which is substantially equal to a width of magnetic track. The length of the sense region and the width of magnetic track correspond to a length 142 of a sense region and a width 144 of magnetic track, respectively, both illustrated in FIG. 21.

Then, a CoCrPt film and a Mo film are successively deposited entirely over the lower gap layer 103, and are patterned through the use of the same mask into the vertical bias layers 104 and the electrode layers 105, respectively, so that the layers 104 and 105 make contact with opposite ends of MR element 121, 122, 23 or 124.

Then, the upper gap layer 108 composed of alumina is deposited covering the vertical bias layers 104, the electrode layers 105 and MR element 122 therewith. Then, the upper shield layer 109 composed of NiFe is formed on the upper gap layer 108 above the electrode layers 105 and MR element 122. The lower gap layer 103 and the upper gap layer 108 are designed to have such a thickness that a data-reading gap 111 defined between the lower and upper shield layers 102 and 109 has a thickness of 0.21 $\mu$m.

Thus, there is completed MR sensor 130 illustrated in FIG. 18.

Hereinbelow is explained another MR sensor 131 including MR element in accordance with the second embodiment, with reference to FIG. 19.

Figure 19:
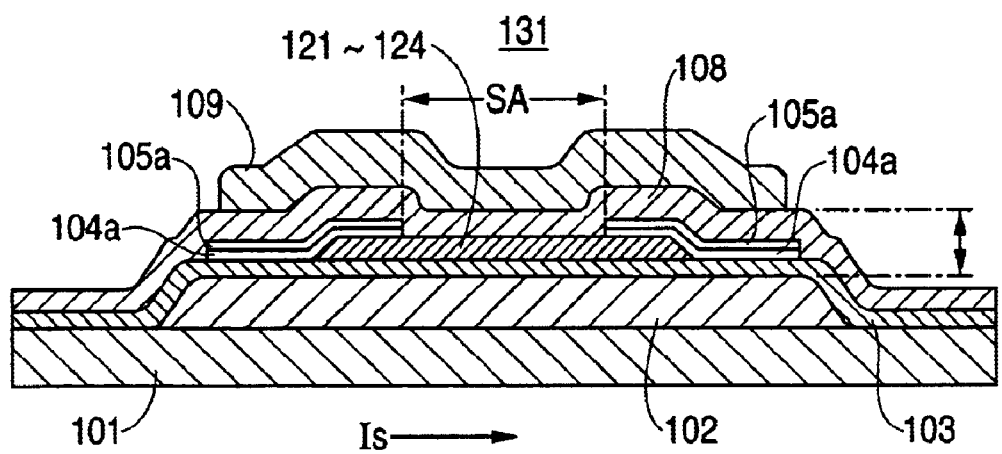
FIG. 19 is a cross-sectional view of another MR sensor including MR element illustrated in FIGS. 17A to 17C.

FIG. 19 is a cross-sectional view of MR sensor 131.

MR sensor 131 illustrated in FIG. 19 has the same structure as that of MR sensor 130 illustrated in FIG. 18 except that vertical bias layers 104a and electrode layers 105a formed on the vertical bias layers 104a are formed to extend from opposite ends to an upper surface of MR element 121, 122, 123 or 124 in a direction in which a sense current flows. A region sandwiched between the electrode layers 105a defines a sense region.

In MR sensor 131, each of the vertical bias layers 104a is designed to make electrical contact with the non-fixed magnetic layer 13 of MR element 121, 122, 123 or 124. Hence, an orientation of magnetization in the non-fixed magnetic layer 13 is perpendicular to an orientation of magnetization in the fixed magnetic layer 15, when an external magnetic field is not applied thereto.

MR sensor 131 illustrated in FIG. 19 is fabricated in accordance with the same process for fabricating MR sensor 130 illustrated in FIG. 18 except the step of forming the vertical bias layers 104a and the electrode layers 105 so that they extend from a sidewall to an upper surface of the multi-layered structure.

Since MR sensors 130 and 131 illustrated in FIGS. 18 and 19 includes one of MR elements 121 to 124 which include a base layer composed of Zr or an alloy thereof, MR sensors 130 and 131 can significantly enhance MR rate in comparison with MR sensor including MR element having a base layer composed of Ta.

In addition, MR sensors 130 and 131 include the vertical bias layers 104 and 104a which make electrical contact with the non-fixed magnetic layer 13 at opposite ends of the multi-layered structure, an orientation of magnetization in the non-fixed magnetic layer 13 is perpendicular to an orientation of magnetization in the fixed magnetic layer 15, when an external magnetic field is not applied thereto. Hence, it is possible to suppress formation of magnetic domain in the non-fixed magnetic layer 13 to thereby prevent generation of Barkhausen noises, and it is also possible to uniformize characteristics of MR rates and enhance linearity of them.

Third Embodiment

A head 201 for magnetically reproducing data, in accordance with the third embodiment of the present invention, is explained hereinbelow with reference to FIG. 20. The magnetically data-reproducing head 201 is comprised of MR sensor 132 having a similar structure to the structure of MR sensor illustrated in FIG. 18 or FIG. 19, and a head 133 for magnetically recording data into a medium.

Figure 20:
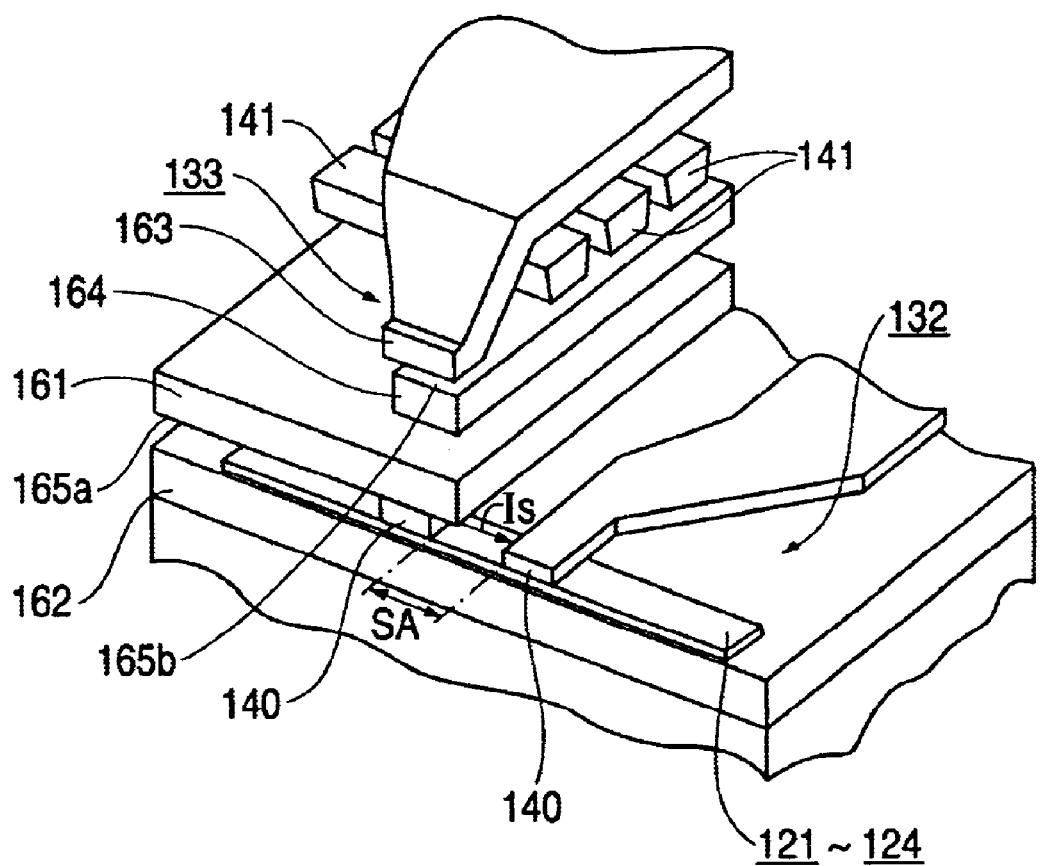
FIG. 20 is a perspective view illustrating a head for magnetically reproducing data, in accordance with the third embodiment of the present invention.

FIG. 20 is a perspective view of the magnetically data-reproducing head 201.

As illustrated in FIG. 20, the magnetically data-recording head 133 is comprised of a lower core 164 formed on an upper shield layer 161 of MR sensor with an electrically insulating layer being sandwiched therebetween, and composed of NiFe, a plurality of coils 141 formed on the lower core 164 with an electrically insulating layer being sandwiched therebetween, and composed of NiFe, and an upper core 163 formed on the coils 141 with an electrically insulating layer being sandwiched therebetween, and composed of NiFe.

A gap between the lower and upper cores 164 and 163 in a plane facing a magnetic disc or a medium for magnetically recording data therein (not illustrated) defines a gap 165b through which data is written into the magnetic disc.

The coils 141 are sandwiched between the lower and upper cores 164 and 163 in a region remote from opposite ends of the lower and upper cores 164 and 163. The electrically insulating layers are designed to have such a thickness that the gap 165b defined between the lower and upper cores 164 and 163 is equal to 0.2 μm. Each of the lower and upper cores 164 and 163 is designed to have a width of 1.5 μm in correspondence with a width 144 of magnetic track illustrated in FIG. 21.

In MR sensor or magnetically reproducing head 132, a gap between lower and upper shield layers 162 and 161 in a plane facing a magnetic disc defines a gap 165b through which data is read out of a magnetic disc. In this embodiment, the gap 165a is designed to have a length of 0.21 μm.

In the gap 165a, end surfaces of MR element 121, 122, 123 or 124 appear in a direction in which a sense current Is flows in a plane facing a magnetic disc.

MR element in this embodiment is designed to have the same multi-layered structure as the multi-layered structure of MR element 121, 122, 123 or 124 illustrated in FIGS. 16 and 17A to 17C, respectively, except that the multi-layered structure in this embodiment has a rectangular planar shape, and a pair of electrode layers 140 is formed on MR element 121, 122, 123 or 124.

Figure 21:
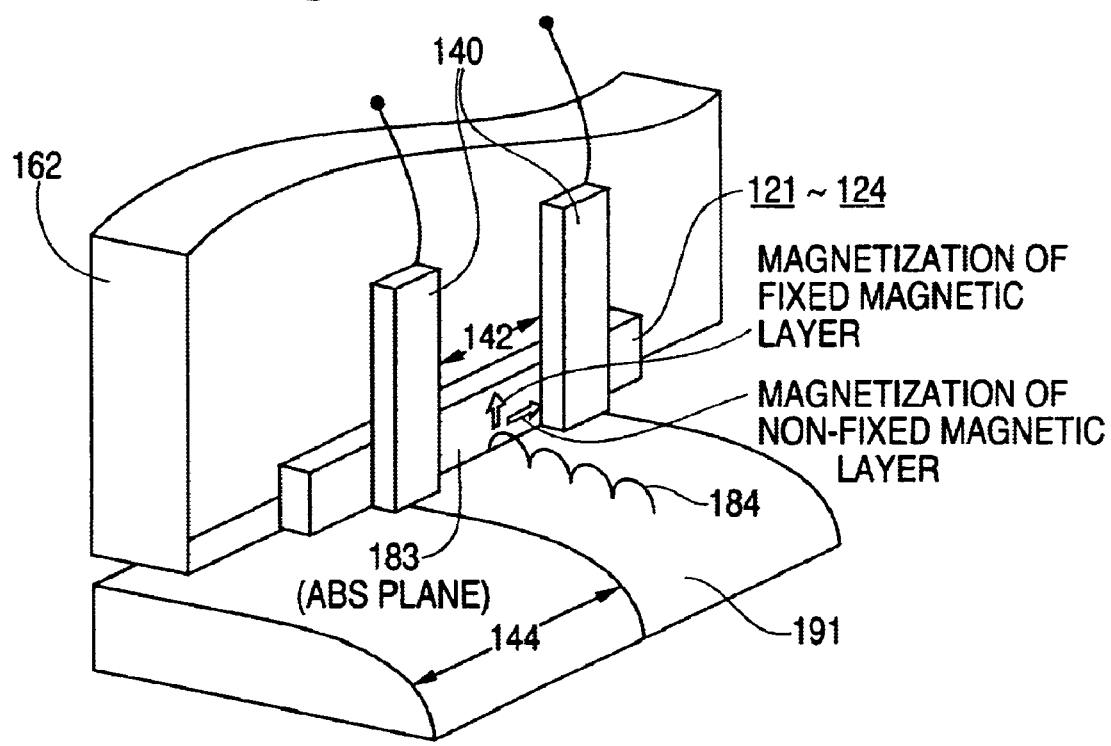
FIG. 21 is a perspective view illustrating a reproduction head in the head illustrated in FIG. 20.

In MR element 121, 122, 123 or 124 illustrated in FIG. 20, a region sandwiched between the electrode layers 140 defines a sense region SA. A sense current Is flows from one of the electrode layers 140 to the other. As illustrated in FIG. 21, a length of the sense region SA in a direction in which a sense current Is flows is defined as a sense region length 142, which is designed based on the width 144 of magnetic track.

Similarly to FIGS. 18 and 19, vertical bias layers may be sandwiched between the electrode layers 140 and MR element 121, 122, 123 or 124. As an alternative, MR sensors 130 or 131 illustrated in FIGS. 18 and 19 may be employed in this embodiment.

A method of fabricating the magnetically data-reproducing head is explained hereinbelow with reference to FIG. 20.

First, the magnetically reproducing head or MR sensor 132 is fabricated in accordance with the same process as having been mentioned in the second embodiment.

Then, a NiFe layer which will make the lower core 164 is deposited on the upper shield layer 161 with an electrically insulating layer being sandwiched therebetween. The NiFe layer is then patterned to thereby form the lower core 164.

Then, a NiFe layer which will make the coils 141 is deposited on the lower core 164 with an electrically insulating layer being sandwiched therebetween. Then, a resist mask is formed on the NiFe film. The NiFe film is etched through the resist mask to thereby form the coils 141.

Then, the coils 141 are covered with an electrically insulating layer. Then, a NiFe layer which will make the upper core layer 163 is deposited on the electrically insulating layer, and is patterned into the upper core 163.

In the magnetically data-recording head 133, the lower and upper cores 164 and 163 are designed to have such a width that a data-writing track width is equal to 1.5 m. The electrically insulating layers are designed to have such a thickness that the gap 165b defined between the lower and upper cores 164 and 163, through which data is written into a medium, is equal to 0.2 μm.

Then, the magnetically data-recording head 133 is shaped into a slider to be fixed at a distal end of an arm 202 illustrated in FIG. 22. Thus, there is completed a head 201 for magnetically reproducing data.

In the above-mentioned step of forming the resist mask for patterning the coils 141, since the resist film is cured at 250 degrees centigrade for 2 hours, the orientations of magnetization of the fixed magnetic layer and the magnetization-bias layer, which orientations have to be kept perpendicular to a direction in which the sense current Is flows, may be rotated, resulting in that MR sensor cannot properly operate as a spin-valve. In such a case, it would be possible to apply again a bias magnetic field to both the fixed magnetic layer and the magnetization bias layer by applying a magnetic field having an intensity of 500 Oe to those layers at 200 degrees centigrade and heating those layers for magnetization for about an hour.

In accordance with the experiment which the inventor had conducted, it was not observed that a magnetization-facilitating axis of the non-fixed magnetic layer was rotated to a direction of magnetization by the above-mentioned heating for magnetization of those layers.

When data is magnetically recorded into a magnetic disc 191 through the magnetically data-reproducing head 201, a magnetic field is first generated by flowing a current through the coils 141. Then, the thus generated magnetic field is introduced into the lower and upper cores 164 and 163, and is leaked through the data-writing gap 165b. Data is written into the magnetic disc 191 by means of the leaked magnetic field.

When data is read out of the magnetic disc 191, as illustrated in FIG. 21, a magnetic field 184 leaked from the magnetic disc 191 is applied to MR layer. As a result, an orientation of magnetization in the non-fixed magnetic layer is rotated in accordance with an intensity and an orientation of the leakage magnetic field 184, and thus, an angle θ formed between an orientation of magnetization in the anti-ferromagnetic layer and an orientation of magnetization in the non-fixed magnetic layer. An electrical resistance of the multi-layered structure or MR layer is varied in proportion to cos θ. The thus varied electrical resistance in the multi-layered structure or MR layer is detected.

As having been explained so far, since the magnetically data-reproducing head in accordance with the third embodiment is designed to include a base layer composed of Zr in MR element 121, 122, 123 or 124, it would be possible to enhance crystallinity of MR layer, and increase a mirror reflectivity of conduction electrons up to over 0.1 to thereby significantly enhance MR rate in comparison with MR sensor including a base layer composed of Ta.

Fourth Embodiment

An apparatus for magnetically reproducing data, in accordance with the fourth embodiment of the present invention, is explained hereinbelow with reference to FIGS. 22A and 22B.

Figure 22A:
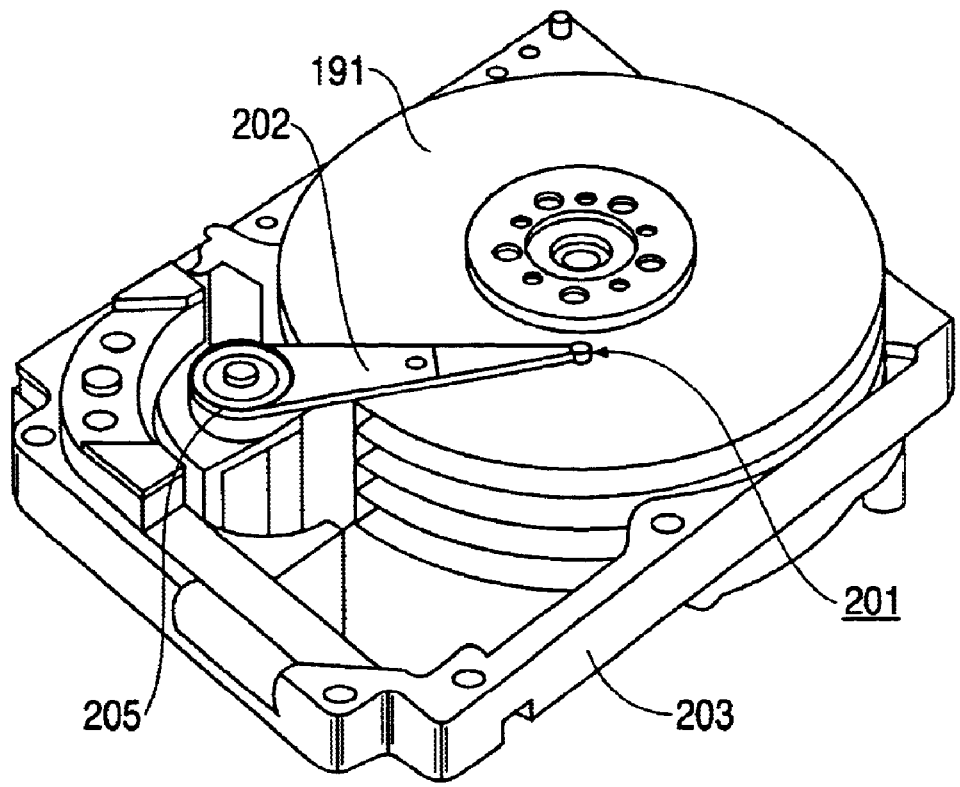
FIG. 22A is a perspective view of an apparatus for magnetically reproducing data, in accordance with the fourth embodiment of the present invention.
Figure 22B:
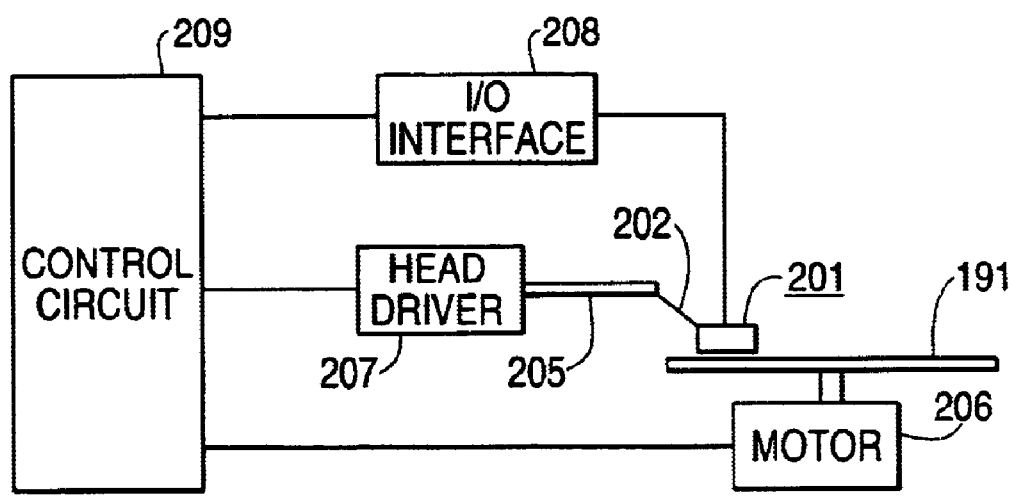
FIG. 22B is a block diagram of the apparatus illustrated in FIG. 22A.

FIG. 22A is a perspective view of the apparatus for magnetically reproducing data, and FIG. 22B is a block diagram of a circuit for driving the apparatus illustrated in FIG. 22A.

As illustrated in FIG. 22A, the apparatus for magnetically reproducing data includes a plurality of magnetically data-recording mediums or magnetic discs 191 on a base 203. In this embodiment, the apparatus is designed to include five magnetic discs 191. Each of the magnetic discs 191 has a diameter of 46 mm, and data is recorded into an area sandwiched between a diameter of 10 mm and a diameter of 40 mm.

The apparatus adopts a buried servo system, which does not require a servo plane, and hence, ensures high densification of data.

The apparatus includes a motor 206 directly coupled to a spindle for rotating the magnetic disc 191. The apparatus further includes a slider 202 which is fixed to a support shaft 205 designed to be rotatable on the base 203 and which can move on the magnetic disc 191 in a radius-wise direction thereof. A head 201 for magnetically reproducing data is secured at a distal end of the slider 202. The magnetically data-reproducing head 201 floats above the magnetic disc 191 when the magnetic disc 191 is in rotation. Though not illustrated, six heads 201 are arranged at upper and lower surfaces of the magnetic disc 191.

The apparatus further includes a head driver 207 and a circuit for processing signals and input/output interface 208 at a lower surface of the base 203. The head driver 207 transmits drive signals to a rotary actuator which drives the support shaft 205 to which the slider 202 is fixed.

The apparatus further includes a control circuit 209 transmitting a control signal to a drive circuit for driving the motor 206, the head driver 207, and the circuit for processing signals and input/output interface 208. The apparatus can be directly connected to an external memory device.

The input/output interface 208 includes a cash memory therein, and acts as a bus line having a transfer speed in the range of 5to 20 megabyte per second. The input/output interface 208 is connected to an external device, for instance, through a 32-bit bus line.

A plurality of the apparatuses may be connected to one another to thereby constitute a magnetic disc apparatus having a big capacity, in which case, an external controller is prepared for controlling the connected apparatuses.

The inventor conducted the experiment for measuring a reproduction output and S/N ratio through the use of the above-mentioned apparatus for magnetically reproducing data.

As MR sensor in a data-reproducing head, there were employed MR sensor 130 illustrated in FIG. 18 and MR sensor 131 illustrated in FIG. 19. In the experiment, there were made five MR sensors 130 in which surface-roughness of both the Zr base layer and the non-fixed magnetic layer was varied in 1.1 nm, 1.6 nm, 2.0 nm, 2.6 nm and 3.7 nm. Similarly, there were made five MR sensors 131 in which surface-roughness of both the Zr base layer and the non-fixed magnetic layer was varied in 1.1 nm, 1.6 nm, 2.0 nm, 2.6 nm and 3.7 nm. The magnetic disc 191 was designed to have coercive force of 2.5 kOe.

Figure 23:
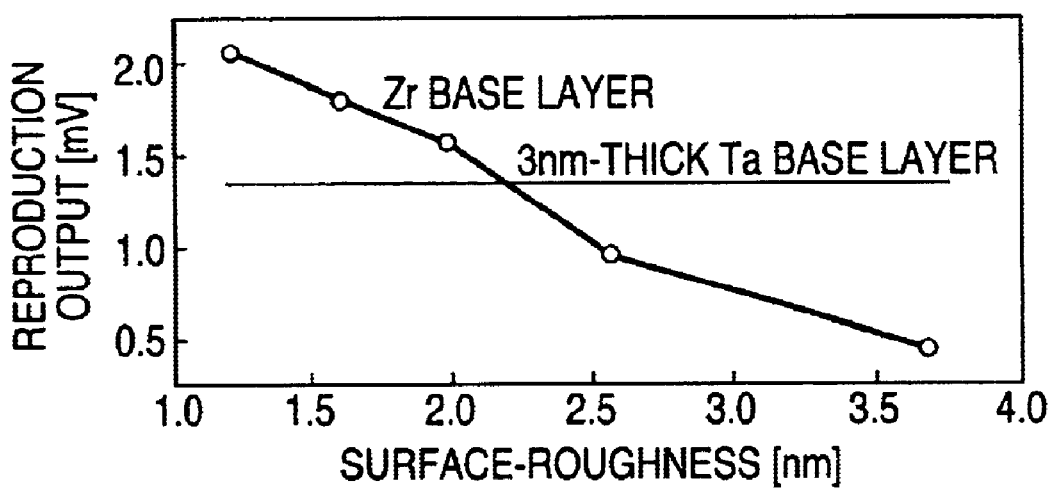
FIG. 23 is a graph showing the results of measuring reproduction output of an apparatus for magnetically reproducing data, including MR sensor illustrated in FIG. 18.
Figure 24:
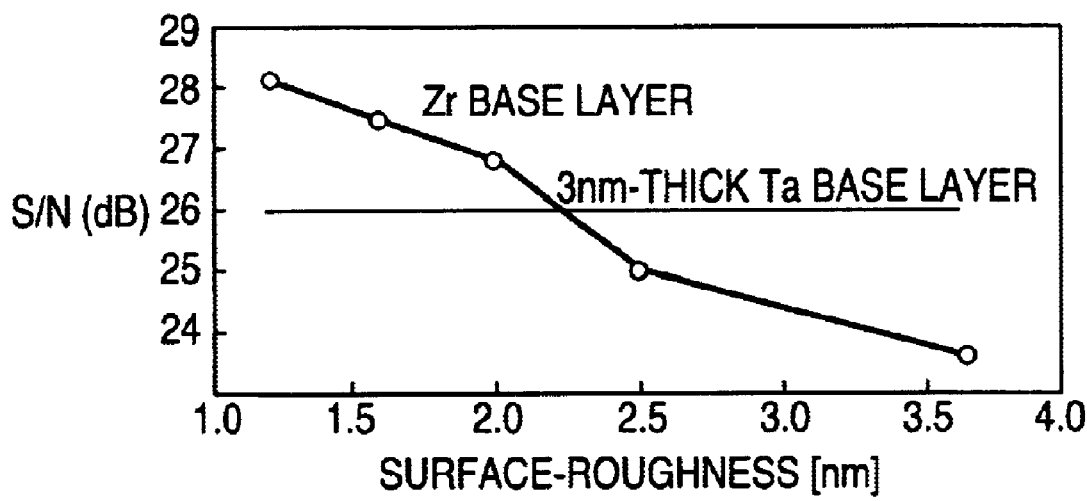
FIG. 24 is a graph showing the results of measuring S/N ratio of an apparatus for magnetically reproducing data, including MR sensor illustrated in FIG. 18.
Figure 25:
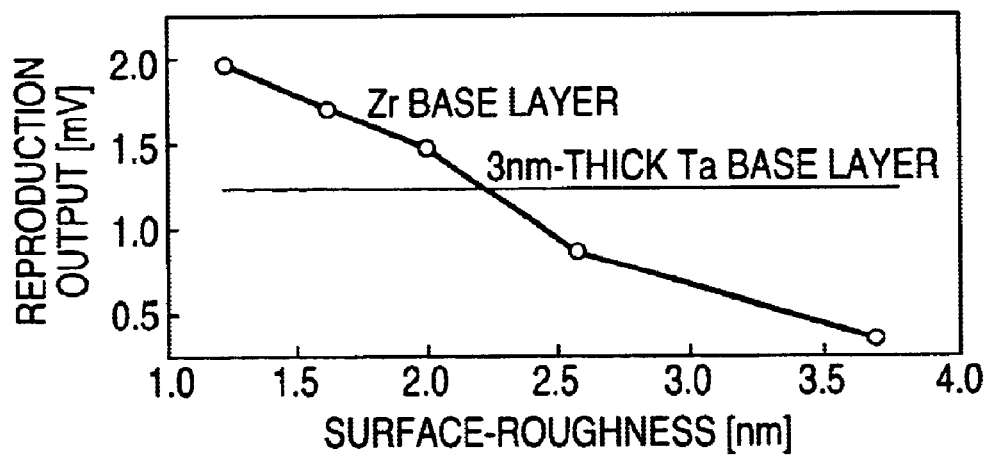
FIG. 25 is a graph showing the results of measuring reproduction output of an apparatus for magnetically reproducing data, including MR sensor illustrated in FIG. 19.
Figure 26:
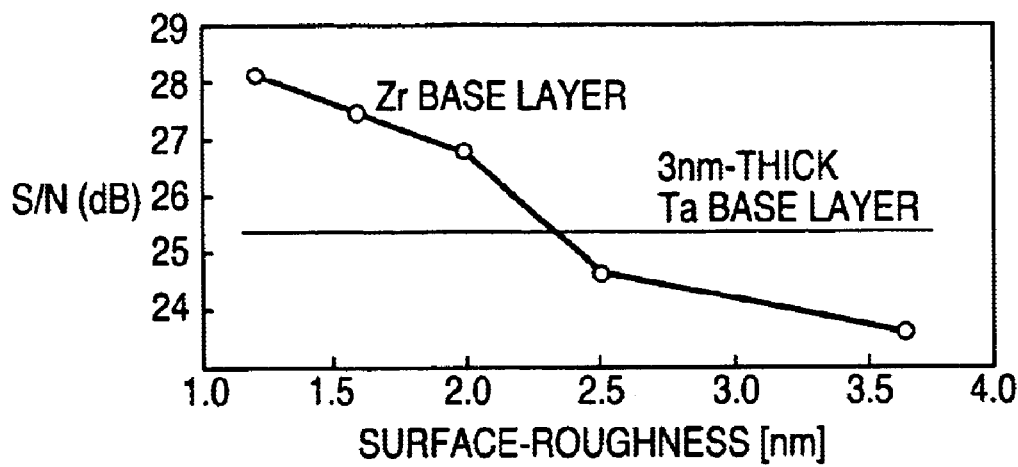
FIG. 26 is a graph showing the results of measuring S/N ratio of an apparatus for magnetically reproducing data, including MR sensor illustrated in FIG. 19.

The results of measurement of reproduction output and S/N ratio in MR sensor 130 are shown in FIGS. 23 and 24, respectively. The results of measurement of reproduction output and S/N ratio in MR sensor 131 are shown in FIGS. 25 and 26, respectively. For comparison, reproduction output and S/N ratio were measured also in MR sensors having the same structure as those of MR sensors 130 and 131 except that a base layer was composed of Ta and had a thickness of 3 nm. The results were also shown in FIGS. 23 to 26.

In FIGS. 23 and 25, the axis of ordinate indicates reproduction output in the unit of mV with linear scale, and the axis of abscissa indicates a surface-roughness in the unit of nanometer with linear scale. In FIGS. 24 and 26, the axis of ordinate indicates S/N ratio in the unit of dB with linear scale, and the axis of abscissa indicates a surface-roughness in the unit of nanometer with linear scale.

As is obvious in view of FIGS. 23, 24, 25 and 26, both the reproduction output and S/N ratio are reduced as the surface-roughness is increased. MR sensor including a base layer composed of Zr is superior to MR sensor including a 3 nm-thick base layer composed of Ta with respect to both the reproduction output and S/N ratio when the surface-roughness is equal to or smaller than 2.0 nm.

When the surface-roughness is equal to or greater than 2.6 nm, MR sensor including a base layer composed of Zr becomes inferior to MR sensor including a 3 nm-thick base layer composed of Ta with respect to both the reproduction output and S/N ratio.

As having been explained so far, since the apparatus for magnetically reproducing data in accordance with the fourth embodiment is designed to include a base layer composed of Zr in MR element 121, 122, 123 or 124, it would be possible to enhance crystallinity of MR layer, and increase a mirror reflectivity of conduction electrons up to over 0.1 to thereby significantly enhance MR rate in comparison with MR sensor including a base layer composed of Ta. By incorporating such MR sensor into an apparatus for magnetically reproducing data, it would be possible to enhance reproduction output, and improve S/N ratio.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, in the above-mentioned embodiments, the layers 13 to 17 are deposited on the base layer 12 in this order in each of MR sensors 121, 122, 123 and 124. To the contrary, the layers 13 to 17 may be deposited on the base layer 12 in reverse order.

Though the present invention is applied to a spin-valve effect type MR sensor in the above-mentioned embodiments, the present invention may be applied to GMR effect type MR sensor or AMR effect type MR sensor.

In the above-mentioned third embodiment, the head for magnetically reproducing data is comprised of MR sensor and the elongate head for magnetically recording data. It should be noted that the head for magnetically reproducing data may be comprised of MR sensor and a vertical head for magnetically recording data.

The entire disclosure of Japanese Patent Application No. 10-336347 filed on Nov. 26, 1998 including specification, claims, drawings and summary is incorporated herein by reference in its entirety.

What is claimed is:

1. A magneto-resistive sensor comprising:
   (a) a multi-layered structure including a base layer, a magnetic layer, and a non-magnetic layer, said magnetic and non-magnetic layers being deposited on or above said base layer, said multi-layered structure having a sense region therein; and
   (b) a pair of electrode layers electrically connected to said sense region at its opposite sides, said electrode layers leading a sense current into said sense region at one side thereof and leading said sense current out of said sense region through the other side thereof,
      said magneto-resistive sensor detecting a magnetic field in accordance with fluctuation in a resistance in said sense region,
      said base layer being composed of zirconium (Zr) or alloy thereof,
      wherein a mirror reflectivity of said base layer at a surface of said base layer that abuts said magnetic layer is equal to or greater than 0.1.

2. The magneto-resistive sensor as set forth in claim 1, wherein said multi-layered structure is comprised of:
   (a) said magnetic layer having magnetization an orientation of which varies in accordance with a magnetic field of a signal provided thereto;
   (b) said non-magnetic layer;
   (c) a second magnetic layer having magnetization an orientation of which is not varied by a magnetic field of a signal provided thereto; and
   (d) a magnetization-bias layer applying said magnetization to said second magnetic layer,
      said layers (a) to (d) being deposited on said base layer in this order or in the opposite order.

3. The magneto-resistive sensor as set forth in claim 2, further comprising at least one magneto-resistance enhancing layer located adjacent to at least one of said magnetic layer and said second magnetic layer.

4. The magneto-resistive sensor as set forth in claim 3, wherein said at least one magneto-resistance enhancing layer comprises a first magneto-resistance enhancing layer that is sandwiched between said magnetic layer and said non-magnetic layer.

5. The magneto-resistive sensor as set forth in claim 3, wherein said at least one magneto-resistance enhancing layer comprises a first magneto-resistance enhancing layer is sandwiched between said non-magnetic layer and said second magnetic layer.

6. The magneto-resistive sensor as set forth in claim 3, wherein said at least one magneto-resistance enhancing layer comprises first and second magneto-resistance enhancing layers, said first magneto-resistance enhancing layer being sandwiched between said magnetic layer and said non-magnetic layer, and said second magneto-resistance enhancing layer being sandwiched between said non-magnetic layer and said second magnetic layer.

7. The magneto-resistive sensor as set forth in claim 3, wherein said magneto-resistance enhancing layer is composed of a material selected from a group consisting of Co, NiFeCo, FeCo, CoFeB, CoZrMo, CoZrNb, CoZr, CoZrTa, CoHf, CoTa, CoTaHf, CoNbHf, CoHfPd, CoTaZrNb, CoZrMoNi, and amorphous material.

8. The magneto-resistive sensor as set forth in claim 3, wherein said magneto-resistance enhancing layer has a thickness in the range of 0.5 nm to 5 nm both inclusive.

9. The magneto-resistive sensor as set forth in claim 2, further comprising second magnetization-bias layers formed at opposite sides of said sense region, said second magnetization-bias layers applying magnetization to said magnetic layer in a direction of said sense current, an orientation of said magnetization being varied in accordance with a magnetic field of a signal provided thereto, each of said second magnetization-bias layers making contact with said-magnetic layer.

10. A The magneto-resistive sensor as set forth in claim 2, wherein an interface between said base layer and said magnetic layer has roughness equal to or smaller than 0.2 nm.

11. The magneto-resistive sensor as set forth in claim 2, wherein an interface between said base layer and said magnetization-bias layer has roughness equal to or smaller than 2 nm.

12. The magneto-resistive sensor as set forth in claim 1, wherein said alloy of zirconium contains at least one of Ta, Hf, W, Cr, Ti, Mo, Pt, Ni, Ir, Cu, Ag, Co, Zn, Ru, Rh, Re, Au, Os, Pd, Nb and V.

13. The magneto-resistive sensor as set forth in claim 1, wherein an interface between said base layer and said magnetic or non-magnetic layer has roughness equal to or smaller than 2 nm.

14. The magneto-resistive sensor as set forth in claim 1, further comprising:
   (a) a lower gap layer formed below said multi-layered structure;

(b) a lower shield layer formed below said lower gap layer;

(c) an upper gap layer formed on said multi-layered structure; and (d) an upper shield layer formed on said upper gap layer.

15. A magneto-resistive sensor comprising:

(a) a substrate;

(b) a lower shield layer formed on said substrate;

(c) a lower gap layer formed on said lower shield layer and composed of electrically insulating material;

(d) a magneto-resistive element formed on said lower gap layer;

(e) an insulating layer formed on said magneto-resistive element;

(f) a pair of magnetization-bias layers formed at opposite sides of said magneto-resistive element;

(g) an upper gap layer formed over said magneto-resistive element and said magnetization-bias layers; and (h) an upper shield layer formed on said upper gap layer, said magneto-resistive element comprising:

(d1) a multi-layered structure including a base layer, a magnetic layer, and a non-magnetic layer, said magnetic and non-magnetic layers being deposited on or above said base layer, said multi-layered structure having a sense region therein, said magnetization-bias layers making electrical contact with said magnetic layer, said base layer being composed of zirconium (Zr) or alloy thereof; and (d2) a pair of electrode layers electrically connected to said sense region at its opposite sides, said electrode layers leading a sense current into said sense region at one side thereof and leading said sense current out of said sense region through the other side thereof, each of said electrode layers being formed on each of said magnetization-bias layers.

16. The magneto-resistive sensor as set forth in claim 15, wherein said lower and upper shield layers are composed of a material selected from a group consisting of NiFe, CoZr, CoFeB, CoZrMo, CoZrNb, CoZrTa, CoHf, CoTa, CoTaHf, CoNbHf, CoHfPd, CoTaZrNb, CoZrMoNi, FeAlSi, and iron nitride.

17. The magneto-resistive sensor as set forth in claim 15, wherein said lower and upper shield layers have a thickness in the range of 0.3 to 10 $\mu$m.

18. The magneto-resistive sensor as set forth in claim 15, wherein said magnetization-bias layers and said electrode layers extend along said magneto-resistive element from its sidewall to its upper surface.

19. The magneto-resistive sensor as set forth in claim 15, wherein said multi-layered structure is comprised of:

(a) said magnetic layer having magnetization an orientation of which varies in accordance with a magnetic field of a signal provided thereto;

(b) said non-magnetic layer;

(c) a second magnetic layer having magnetization an orientation of which is not varied by a magnetic field of a signal provided thereto; and (d) a magnetization-bias layer applying said magnetization to said second magnetic layer, said layers (a) to (d) being deposited on said base layer in this order or in the opposite order.

20. The magneto-resistive sensor as set forth in claim 19, wherein said magneto-resistive element further includes second magnetization-bias layers formed at opposite sides of said sense region, said second magnetization-bias layers applying magnetization to said magnetic layer in a direction of said sense current, an orientation of said magnetization being varied in accordance with a magnetic field of a signal provided thereto, each of said second magnetization-bias layers making contact with said first magnetic layer.

21. The magneto-resistive sensor as set forth in claim 19, wherein an interface between said base layer and said magnetic layer has roughness equal to or smaller than 2 nm.

22. The magneto-resistive sensor as set forth in claim 19, wherein an interface between said base layer and said magnetization-bias layer has roughness equal to or smaller than 2 nm.

23. The magneto-resistive sensor as set forth in claim 19, wherein an interface between said base layer and said magnetic layer has mirror reflectivity equal to or greater than 0.1.

24. The magneto-resistive sensor as set forth in claim 19, wherein an interface between said base layer and said magnetization-bias layer has mirror reflectivity equal to or greater than 0.1.

25. The magneto-resistive sensor as set forth in claim 15, wherein said magneto-resistive element further includes at least one magneto-resistance enhancing layer located adjacent to at least one of said magnetic layer and said second magnetic layer.

26. The magneto-resistive sensor as set forth in claim 25, wherein said at least one magneto-resistance enhancing layer comprises first and second magneto-resistance enhancing layers, said first magneto-resistance enhancing layer being sandwiched between said magnetic layer and said non-magnetic layer, and said second magneto-resistance enhancing layer being sandwiched between said non-magnetic layer and said second magnetic layer.

27. The magneto-resistive sensor as set forth in claim 25, wherein said magneto-resistance enhancing layer is composed of a material selected from a group consisting of Co, NiFeCo, FeCo, CoFeB, CoZrMo, CoZrNb, CoZr, CoZrTa, CoHf, CoTa, CoTaHf, CoNbHf, CoHfPd, CoTaZrNb, CoZrMoNi, and amorphous material.

28. The magneto-resistive sensor as set forth in claim 25, wherein said magneto-resistance enhancing layer has a thickness in the range of 0.5 nm to 5 nm both inclusive.

29. The magneto-resistive sensor as set forth in claim 15, wherein said alloy of zirconium contains at least one of Ta, Hf, W, Cr, Ti, Mo, Pt, Ni, Ir, Cu, Ag, Co, Zn, Ru, Rh, Re, Au, Os, Pd, Nb and V.

30. The magneto-resistive sensor as set forth in claim 15, wherein an interface between said base layer and said magnetic or non-magnetic layer has roughness equal to or smaller than 2 nm.

31. The magneto-resistive sensor as set forth in claim 15, wherein an interface between said base layer and said magnetic or non-magnetic layer has mirror reflectivity equal to or greater than 0.1.

32. An apparatus for magnetically reproducing data, comprising:

(a) a magneto-resistive sensor which reads data out of a medium magnetically storing data therein;

(b) a head magnetically recording data into said medium, and formed on said magneto-resistive sensor;

(c) a slider sliding on said medium, said magneto-resistive sensor and said head being fixed to said slider; and (d) a device moving said slider to thereby position said magneto-resistive sensor and said head at a predetermined region on said medium, said magneto-resistive sensor comprising:

(a1) a multi-layered structure including a base layer, a magnetic layer, and a non-magnetic layer, said magnetic and non-magnetic layers being deposited on or above said base layer, said multi-layered structure having a sense region therein; and (a2) a pair of electrode layers electrically connected to said sense region at its opposite sides, said electrode layers leading a sense current into said sense region at one side thereof and leading said sense current out of said sense region through the other side thereof, said magneto-resistive sensor detecting a magnetic field in accordance with fluctuation in a resistance in said sense region, said base layer being composed of zirconium (Zr) or alloy thereof, wherein a mirror reflectivity of said base layer at a surface of said base layer that abuts said magnetic layer is equal to or greater than 0.1.

33. The apparatus as set forth in claim 32, wherein said head is comprised of:
(a) a coil generating lines of magnetic force when a current flows therethrough; and
(b) lower and upper cores sandwiching said coil therebetween so that said lower and upper coils define a gap between them and said medium, said lower and upper cores directing said lines of magnetic force.

34. The apparatus as set forth in claim 32, wherein said multi-layered structure is comprised of:
(a) said magnetic layer having magnetization an orientation of which varies in accordance with a magnetic field of a signal provided thereto;
(b) said non-magnetic layer;
(c) a second magnetic layer having magnetization an orientation of which is not varied by said a magnetic field of a signal provided thereto; and
(d) a magnetization-bias layer applying said magnetization to said second magnetic layer,
said layers (a) to (d) being deposited on said base layer in this order or in the opposite order.

35. The apparatus as set forth in claim 34, wherein said magneto-resistive sensor further includes at least one magneto-resistance enhancing layer located adjacent to at least one of said magnetic layer and said second magnetic layer.

36. The apparatus as set forth in claim 35, wherein said at least one magneto-resistance enhancing layer comprises first and second it a magneto-resistance enhancing layers, said first magneto-resistance enhancing layer being sandwiched between said magnetic layer and said non-magnetic layer, and said second magneto-resistance enhancing layer being sandwiched between said non-magnetic layer and said second magnetic layer.

37. The apparatus as set forth in claim 35, wherein said magneto-resistance enhancing layer is composed of a material selected from a group consisting of Co, NiFeCo, FeCo, CoFeB, CoZrMo, CoZrNb, CoZr, CoZrTa, CoHf, CoTa, CoTaHf, CoNbHf, CoHfd, CoTaZrNb, CoZrMoNi, and amorphous material.

38. The apparatus as set forth in claim 35, wherein said magneto-resistance enhancing layer has a thickness in the range of 0.5 nm to 5 nm both inclusive.

39. The apparatus as set forth in claim 34, wherein said magneto-resistive sensor further includes second magnetization-bias layers formed at opposite sides of said sense region, said second magnetization-bias layers applying magnetization to said magnetic layer in a direction of said sense current, an orientation of said magnetization being varied in accordance with a magnetic field of a signal provided thereto, each of said second magnetization-bias layers making contact with said first magnetic layer.

40. The apparatus as set forth in claim 34, wherein an interface between said base layer and said magnetic layer has roughness equal to or smaller than 2 nm.

41. The apparatus as set forth in claim 32, wherein said alloy of zirconium contains at least one of Ta, Hf, W, Cr, Ti, Mo, Pt, Ni, Ir, Cu, Ag, Co, Zn, Ru, Rh, Re, Au, Os, Pd, Nb and V.

42. The apparatus as set forth in claim 32, wherein an interface between said base layer and said magnetic or non-magnetic layer has roughness equal to or smaller than 2 nm.

43. The apparatus as set forth in claim 34, wherein an interface between said base layer and said magnetization-bias layer has roughness equal to or smaller than 2 nm.

44. The apparatus as set forth in claim 32, wherein said magneto-resistive sensor further includes:
(a) a lower gap layer formed below said multi-layered structure;
(b) a lower shield layer formed below said lower gap layer;
(c) an upper gap layer formed on said multi-layered structure; and
(d) an upper shield layer formed on said upper gap layer.

45. An apparatus for magnetically reproducing data, comprising:
(a) a magneto-resistive sensor which reads data out of a medium magnetically storing data therein;
(b) a head magnetically recording data into said medium, and formed on said magneto-resistive sensor;
(c) a slider sliding on said medium, said magneto-resistive sensor and said head being fixed to said slider; and
(d) a device moving said slider to thereby position said magneto-resistive sensor and said head at a predetermined region on said medium, said magneto-resistive sensor comprising:
(a1) a substrate;
(a2) a lower shield layer formed on said substrate;
(a3) a lower gap layer formed on said lower shield layer and composed of electrically insulating material;
(a4) a magneto-resistive element formed on said lower gap layer;
(a5) an insulating layer formed on said magneto-resistive element;
(a6) a pair of magnetization-bias layers formed at opposite sides of said magneto-resistive element;
(a7) an upper gap layer formed over said magneto-resistive element and said magnetization-bias layers; and
(a8) an upper shield layer formed on said upper gap layer, said magneto-resistive element comprising:
(a41) a multi-layered structure including a base layer, a magnetic layer, and a non-magnetic layer, said magnetic and non-magnetic layers being deposited on or above said base layer, said multi-layered structure having a sense region therein, said magnetization-bias layers making electrical contact with said magnetic layer, said base layer being composed of zirconium (Zr) or alloy thereof; and
(a42) a pair of electrode layers electrically connected to said sense region at its opposite sides, said electrode layers leading a sense current into said sense region at one side thereof and leading said sense current out of said sense region through the other side thereof, each of said electrode layers being formed on each of said magnetization-bias layers.

* * * * *